US012648299B2

(12) United States Patent
Mizukoshi et al.

(10) Patent No.: US 12,648,299 B2
(45) Date of Patent: Jun. 2, 2026

(54) MANUFACTURING METHOD OF DISPLAY DEVICE AND EVAPORATION DEVICE

(71) Applicant: Magnolia White Corporation, Tokyo (JP)

(72) Inventors: Hirofumi Mizukoshi, Tokyo (JP); Kaichi Fukuda, Tokyo (JP); Takanobu Takenaka, Tokyo (JP); Masaru Takayama, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 452 days.

(21) Appl. No.: 18/317,946

(22) Filed: May 16, 2023

(65) Prior Publication Data

US 2023/0380216 A1     Nov. 23, 2023

(30) Foreign Application Priority Data

May 23, 2022     (JP) ................................. 2022-083932

(51) Int. Cl.
*H10K 71/60*          (2023.01)
*C23C 14/06*          (2006.01)
(Continued)

(52) U.S. Cl.
CPC ..... *H10K 59/1201* (2023.02); *C23C 14/0694* (2013.01); *C23C 14/14* (2013.01); *C23C 14/24* (2013.01); *C23C 14/505* (2013.01); *H10K 71/60* (2023.02); *H10K 59/122* (2023.02); *H10K 59/8052* (2023.02); *H10K 59/873* (2023.02); *H10K 2102/20* (2023.02)

(58) Field of Classification Search
CPC ..... C23C 14/04; C23C 14/0694; C23C 14/14; C23C 14/225; C23C 14/24; C23C 14/505; C23C 14/56; H10K 2102/20; H10K 59/1201; H10K 59/122; H10K 59/8052; H10K 59/873; H10K 71/60
See application file for complete search history.

(56) References Cited

U.S. PATENT DOCUMENTS 5,952,037 A * 9/1999 Nagayama ........... H10K 59/127
427/404
2004/0160170 A1 8/2004 Sato et al.
(Continued)

FOREIGN PATENT DOCUMENTS

JP     2000-195677 A     7/2000
JP     2004-207217 A     7/2004
(Continued)

*Primary Examiner* — Jaehwan Oh
(74) *Attorney, Agent, or Firm* — XSENSUS LLP

(57) ABSTRACT

According to one embodiment, a manufacturing method of a display device includes preparing a processing substrate, forming an organic layer, and forming an etching stopper layer on the organic layer. The forming the etching stopper layer includes carrying the processing substrate into a chamber, inside the chamber, emitting a material for forming the etching stopper layer from an evaporation source which inclines with respect to a normal of the processing substrate, and conveying the processing substrate while rotating the processing substrate in a plane orthogonal to the normal, and depositing the material emitted from the evaporation source on the processing substrate.

10 Claims, 19 Drawing Sheets

(51) Int. Cl.
    *C23C 14/14*         (2006.01)
    *C23C 14/24*         (2006.01)
    *C23C 14/50*         (2006.01)
    *H10K 59/12*         (2023.01)
    *H10K 59/122*       (2023.01)
    *H10K 59/80*         (2023.01)
    *H10K 102/20*       (2023.01)

(56)           References Cited

U.S. PATENT DOCUMENTS

| | | | |
|---|---|---|---|
| 2009/0009069 A1* | 1/2009 | Takata | H10K 59/122 |
| | | | 445/24 |
| 2019/0363275 A1 | 11/2019 | Ochi et al. | |
| 2022/0077251 A1* | 3/2022 | Choung | H10K 59/873 |
| 2025/0163562 A1* | 5/2025 | Turchetti | H10N 60/12 |

FOREIGN PATENT DOCUMENTS

| | | | |
|---|---|---|---|
| JP | 2008-135325 A | 6/2008 | |
| JP | 2009-32673 A | 2/2009 | |
| JP | 2010-118191 A | 5/2010 | |
| WO | 2018/179308 A1 | 10/2018 | |

* cited by examiner

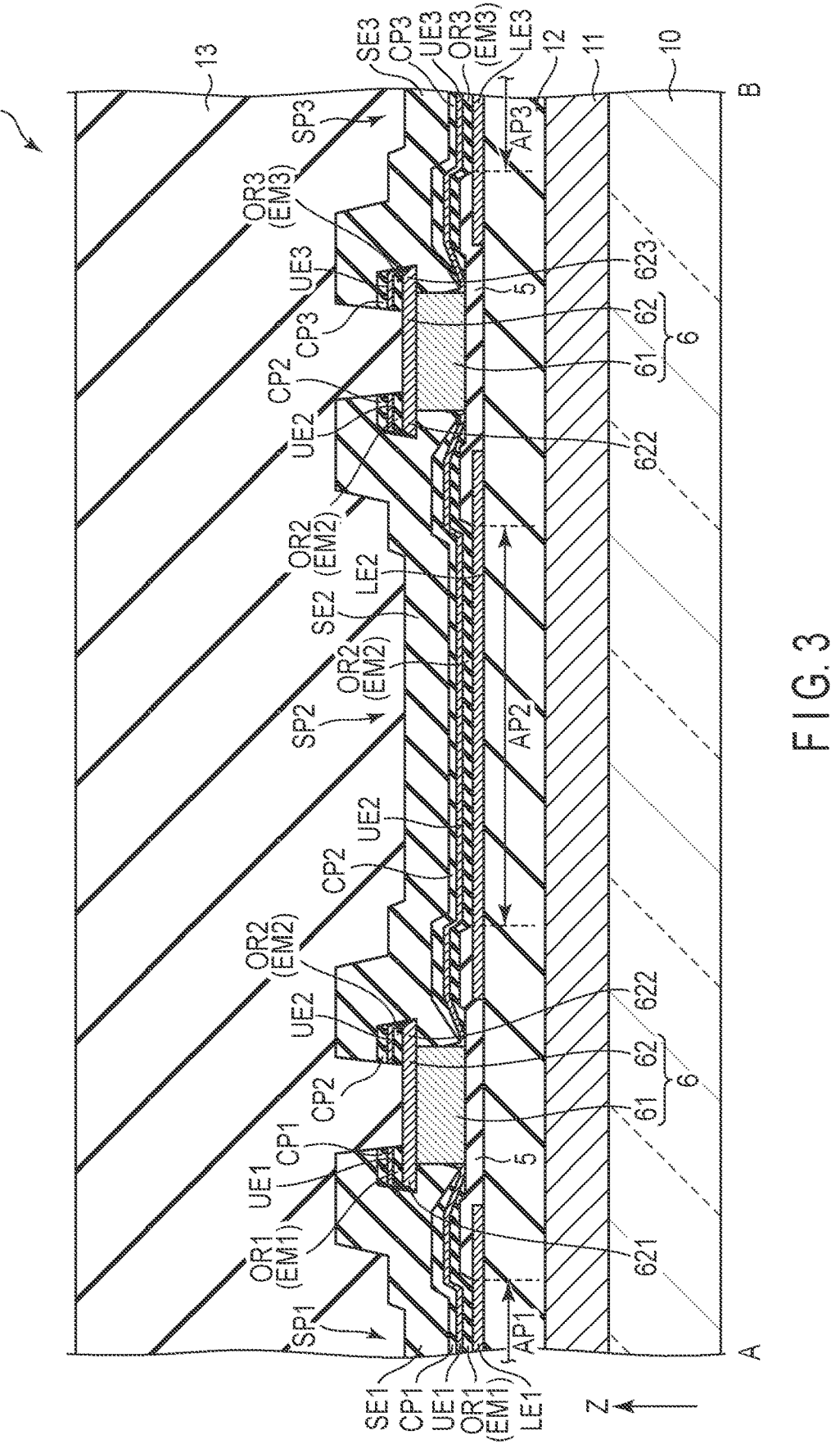
F I G. 3

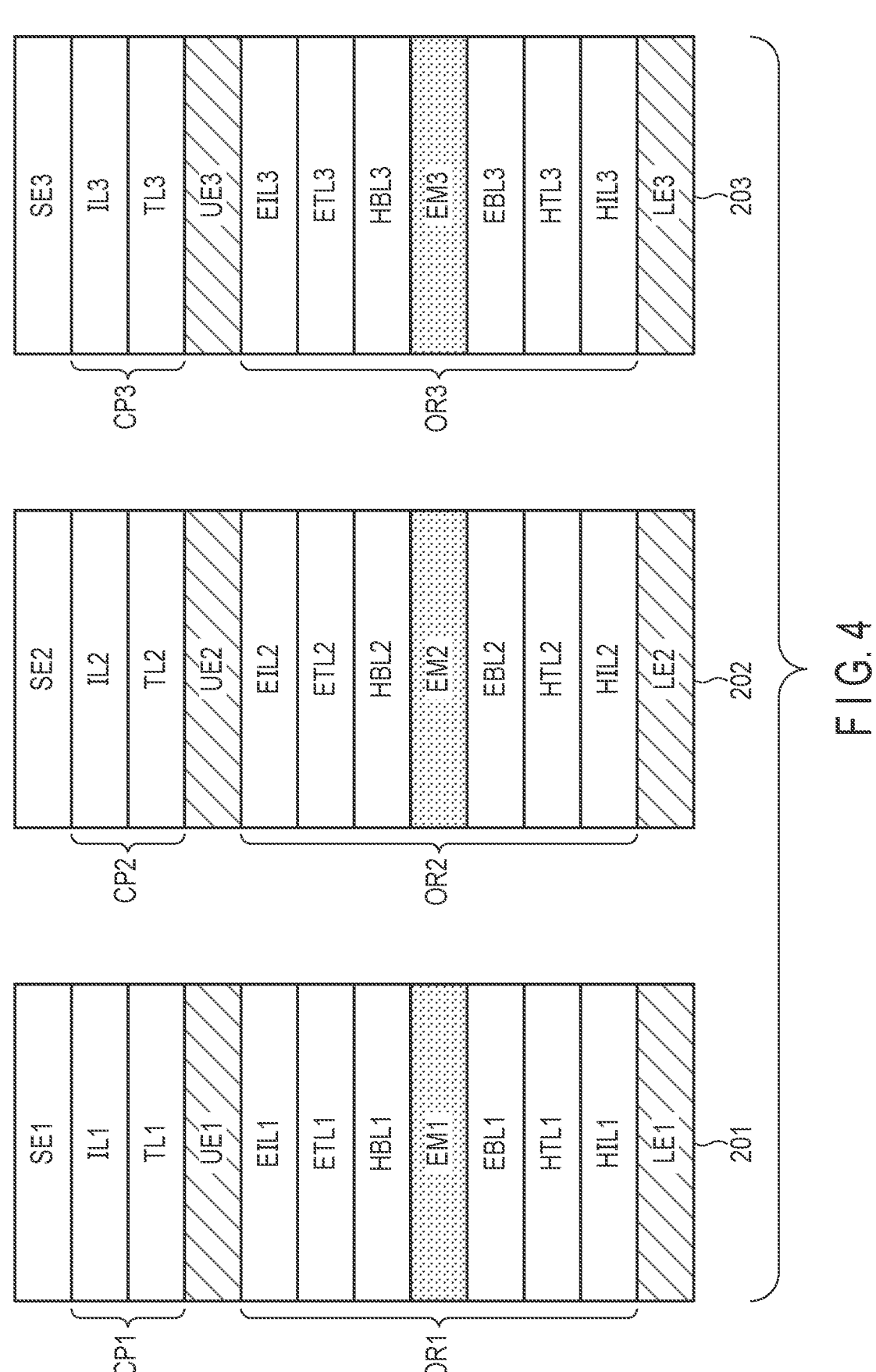
F I G. 4

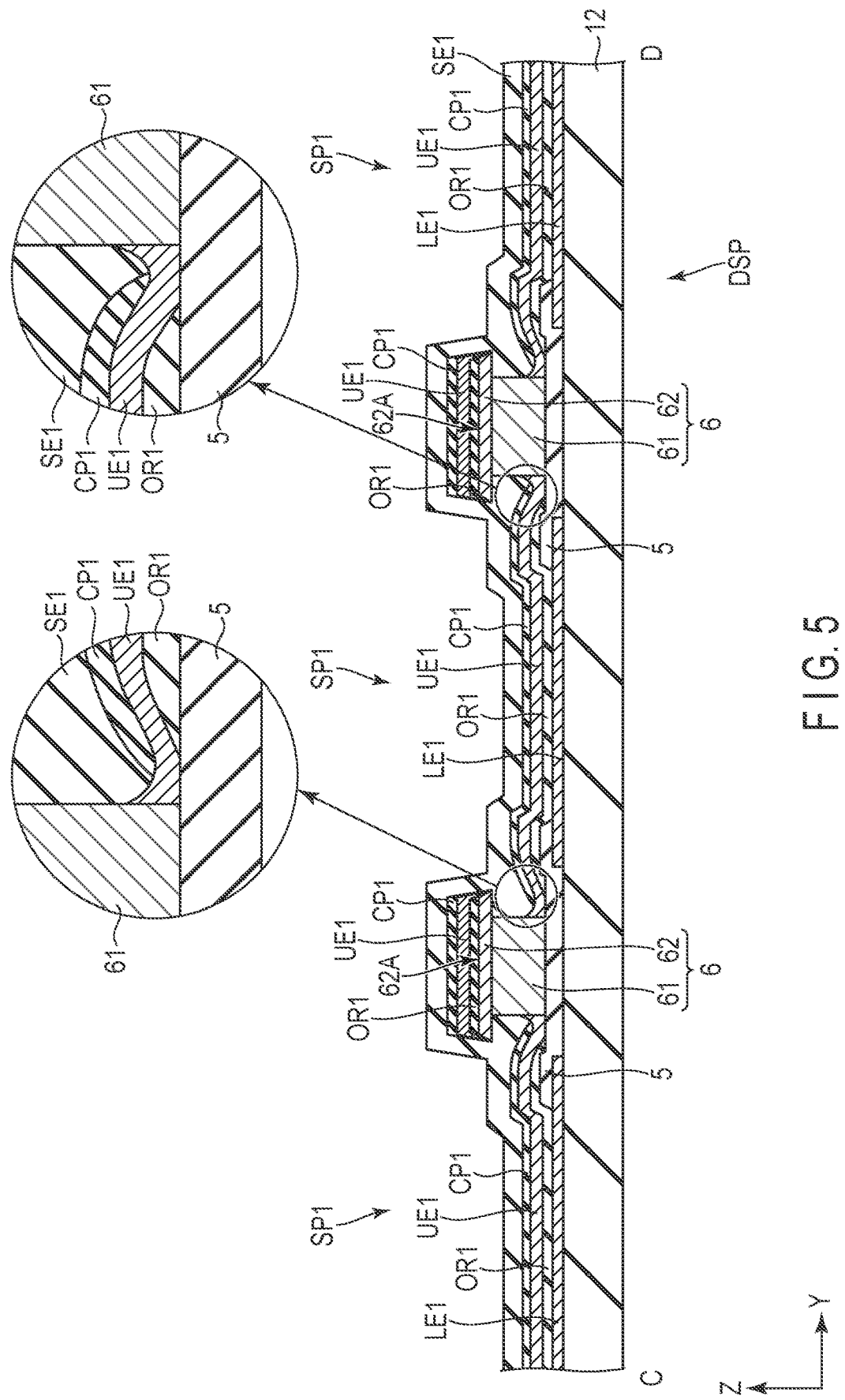
F I G. 5

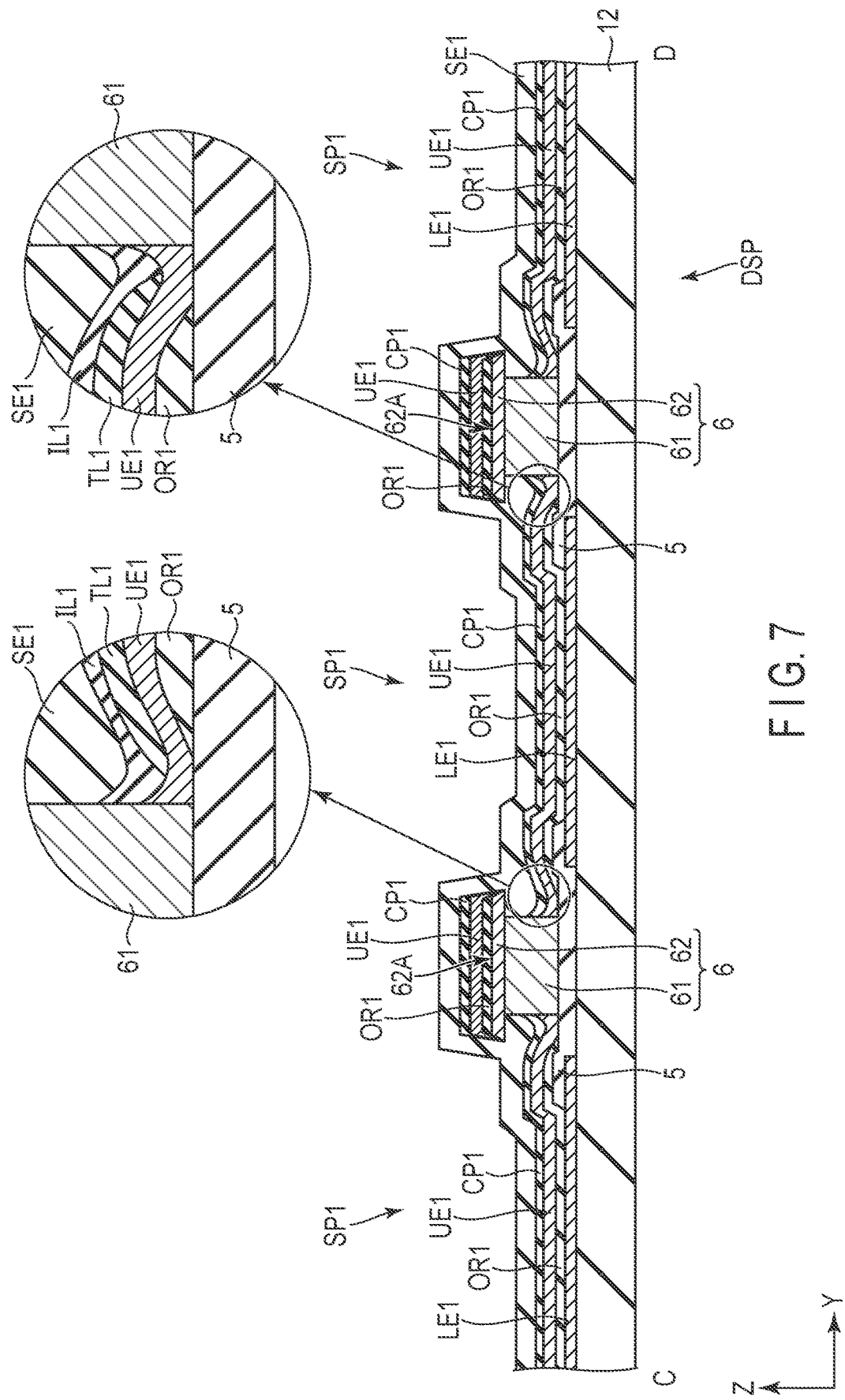
F I G. 7

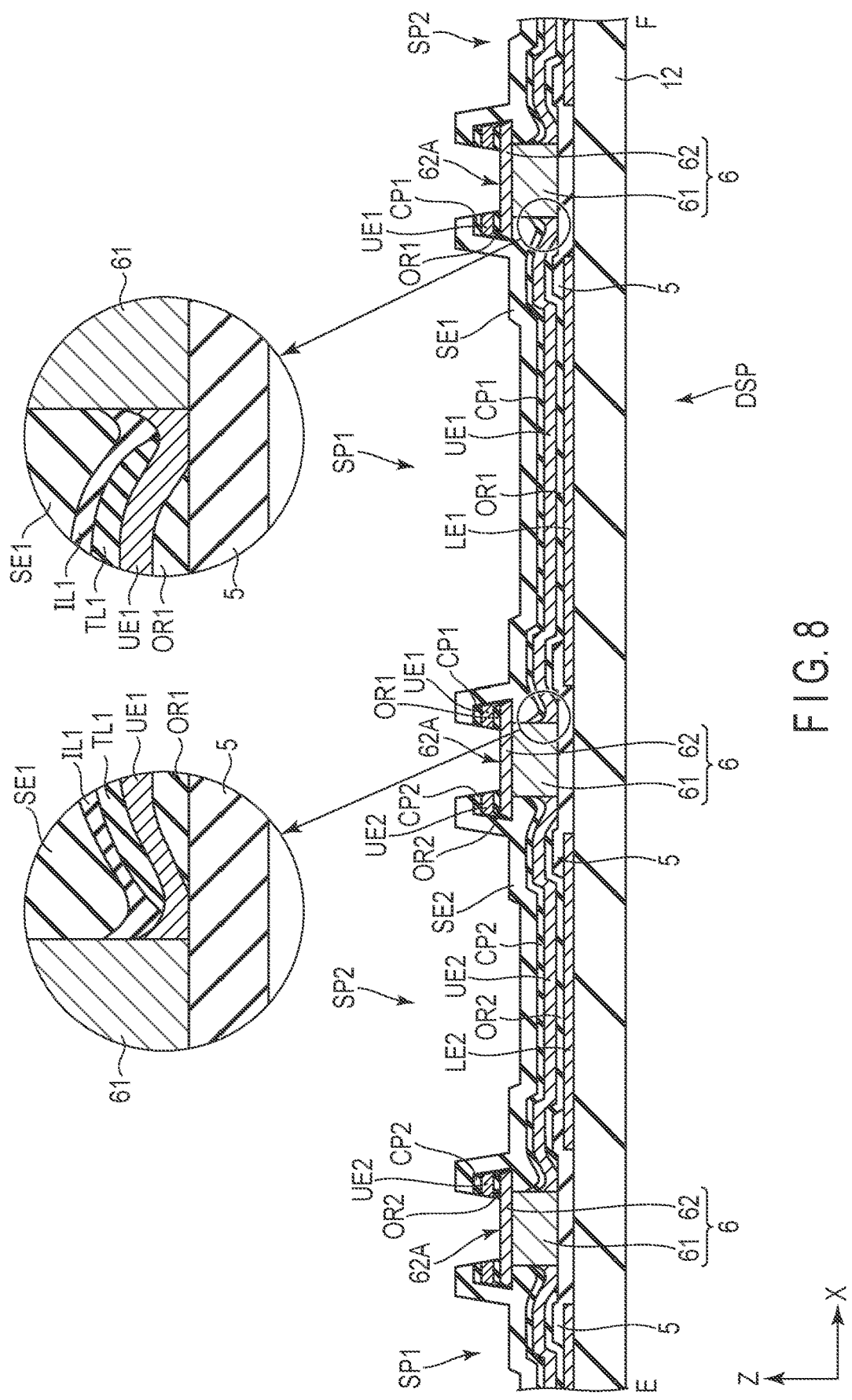
F I G. 8

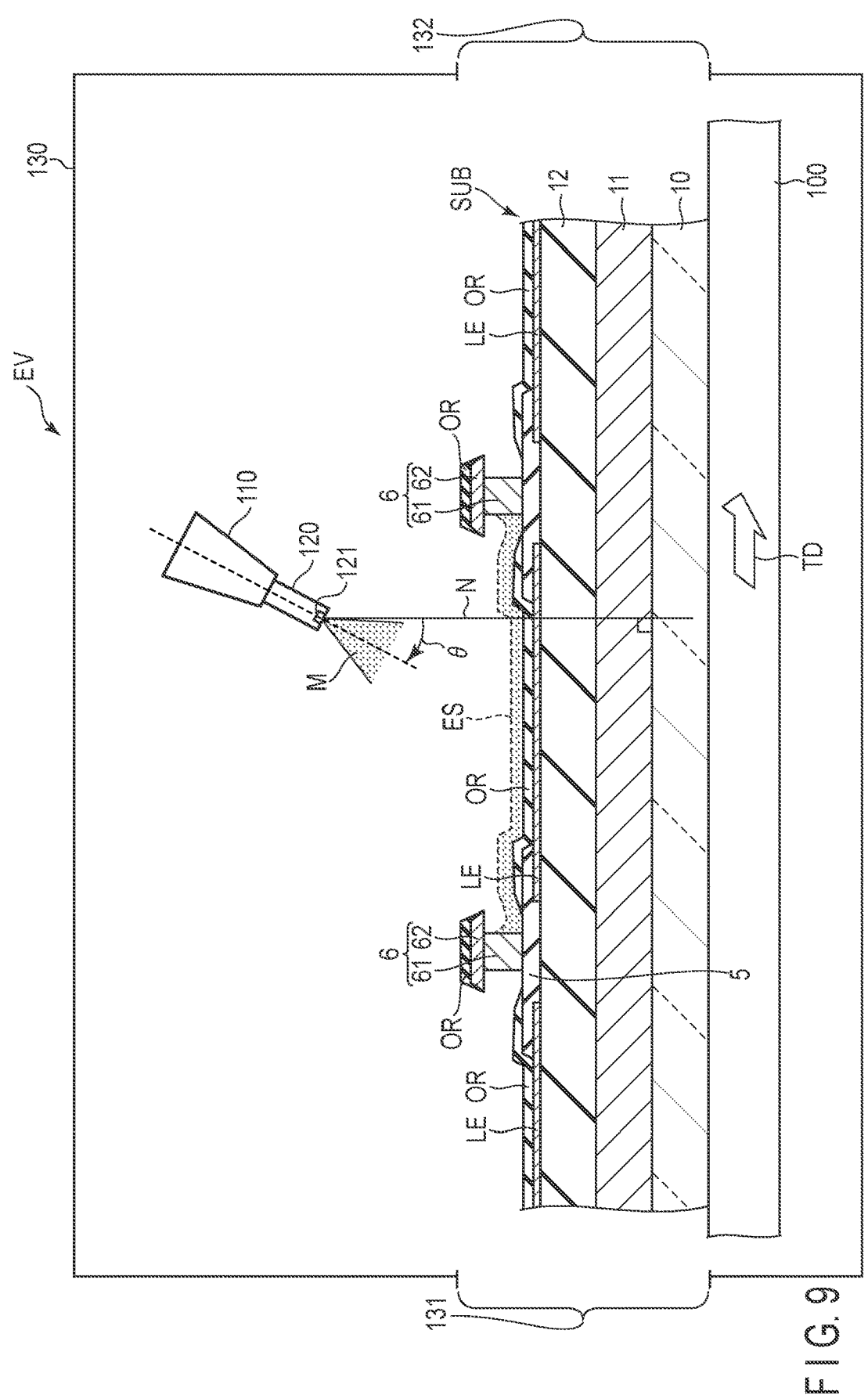
F I G. 9

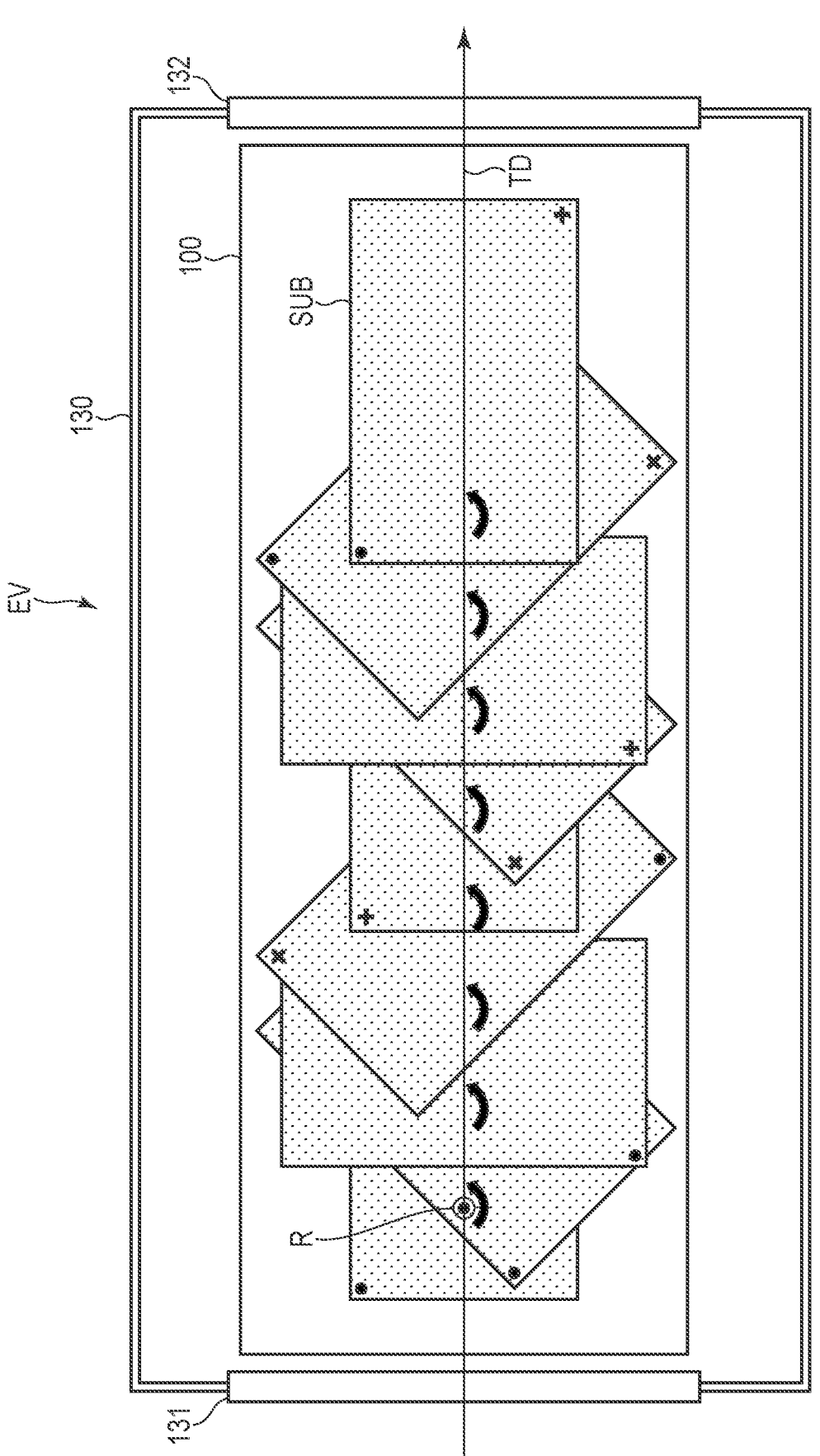
F I G. 10

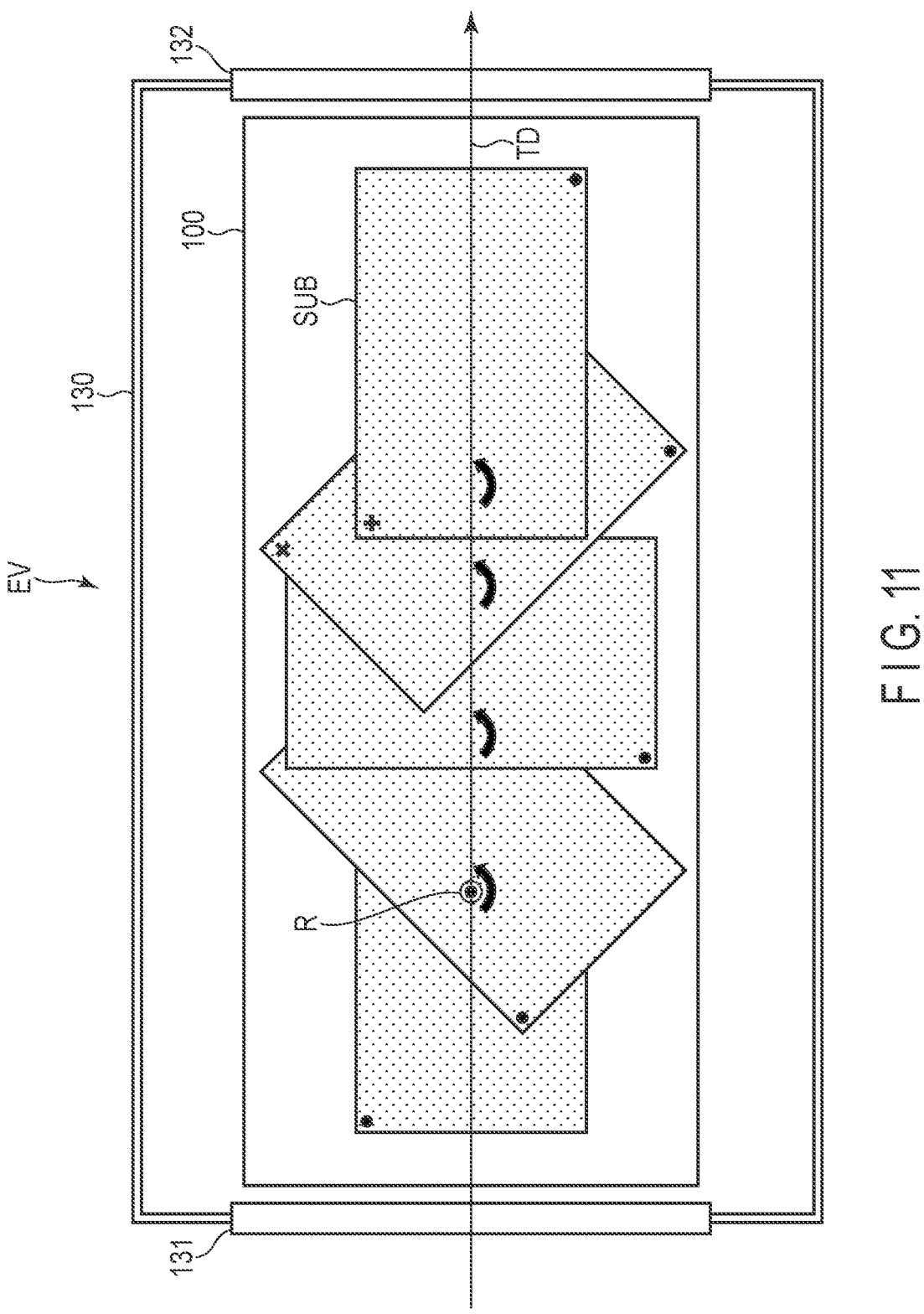
F I G. 11

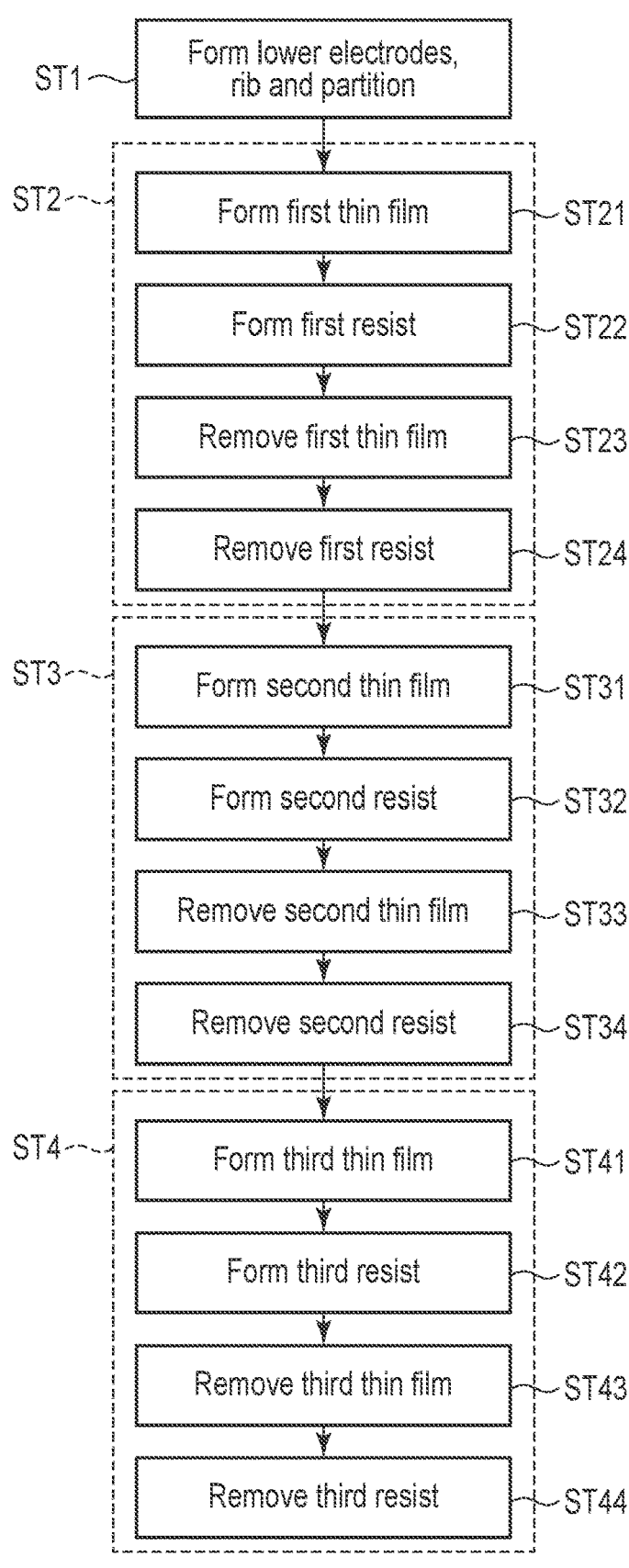
ST1 — Form lower electrodes, rib and partition
ST2
Form first thin film — ST21
Form first resist — ST22
Remove first thin film — ST23
Remove first resist — ST24
ST3
Form second thin film — ST31
Form second resist — ST32
Remove second thin film — ST33
Remove second resist — ST34
ST4
Form third thin film — ST41
Form third resist — ST42
Remove third thin film — ST43
Remove third resist — ST44
F I G. 12

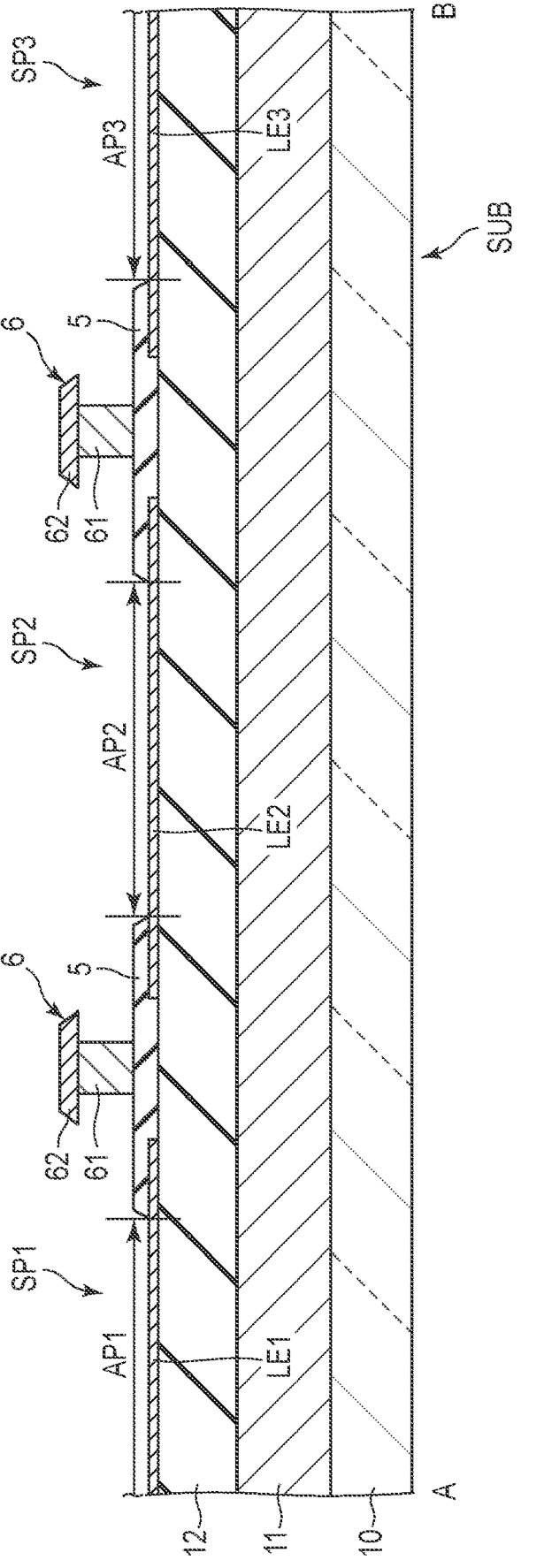
F I G. 13

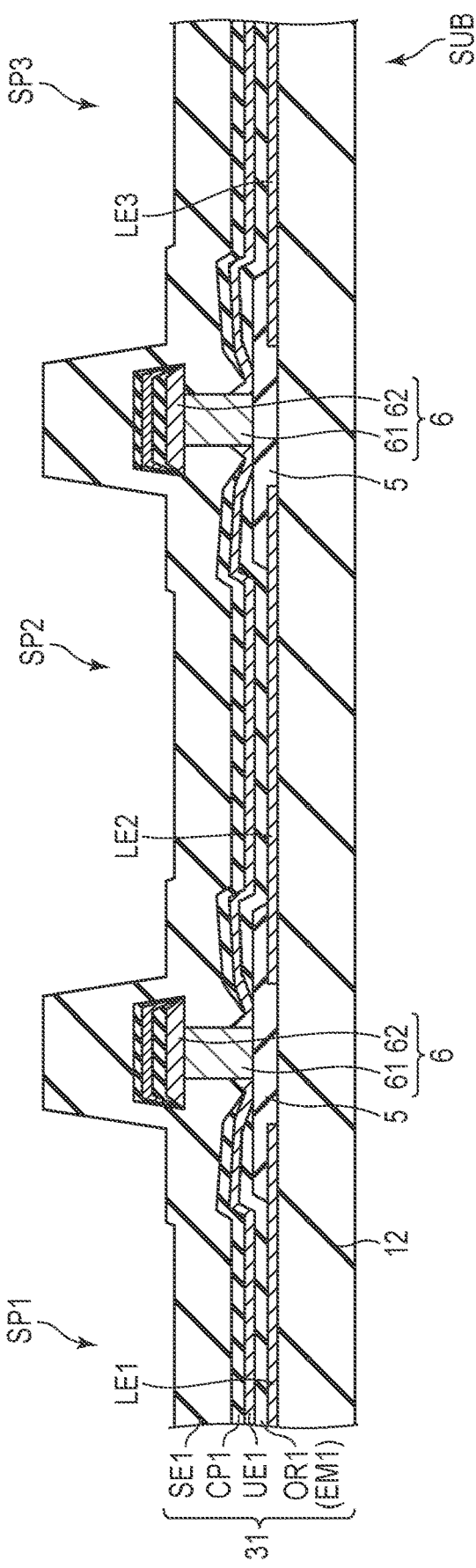
F I G. 14

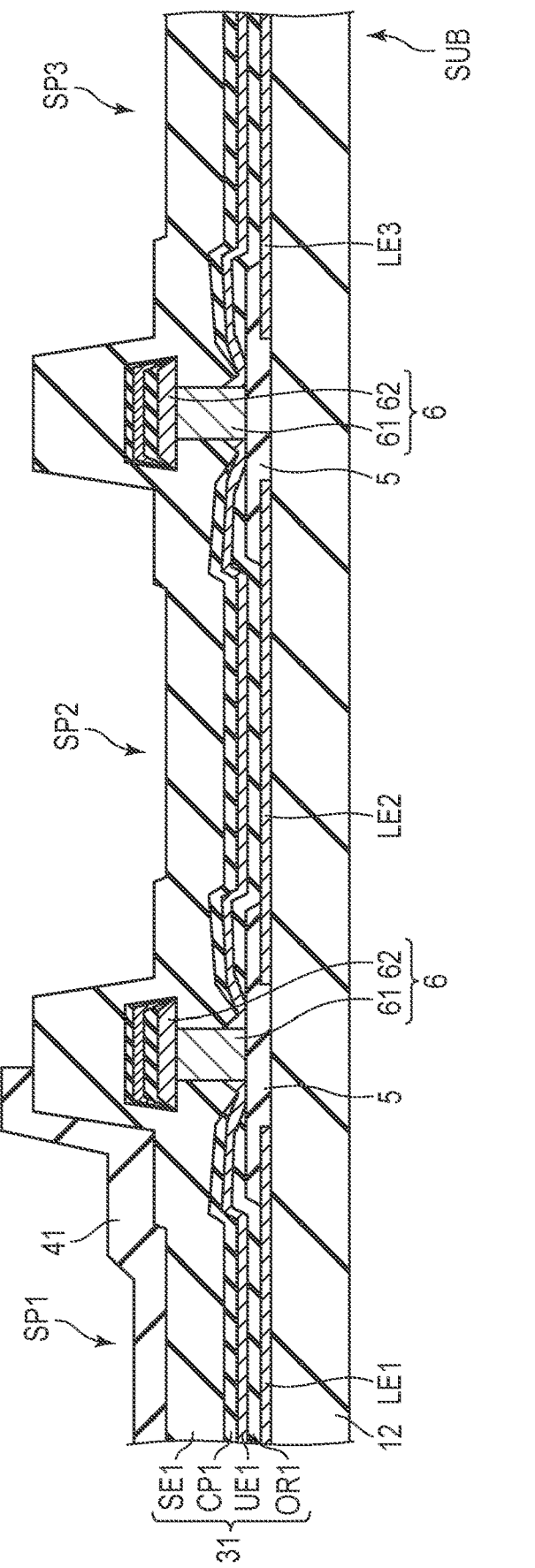
F I G. 16

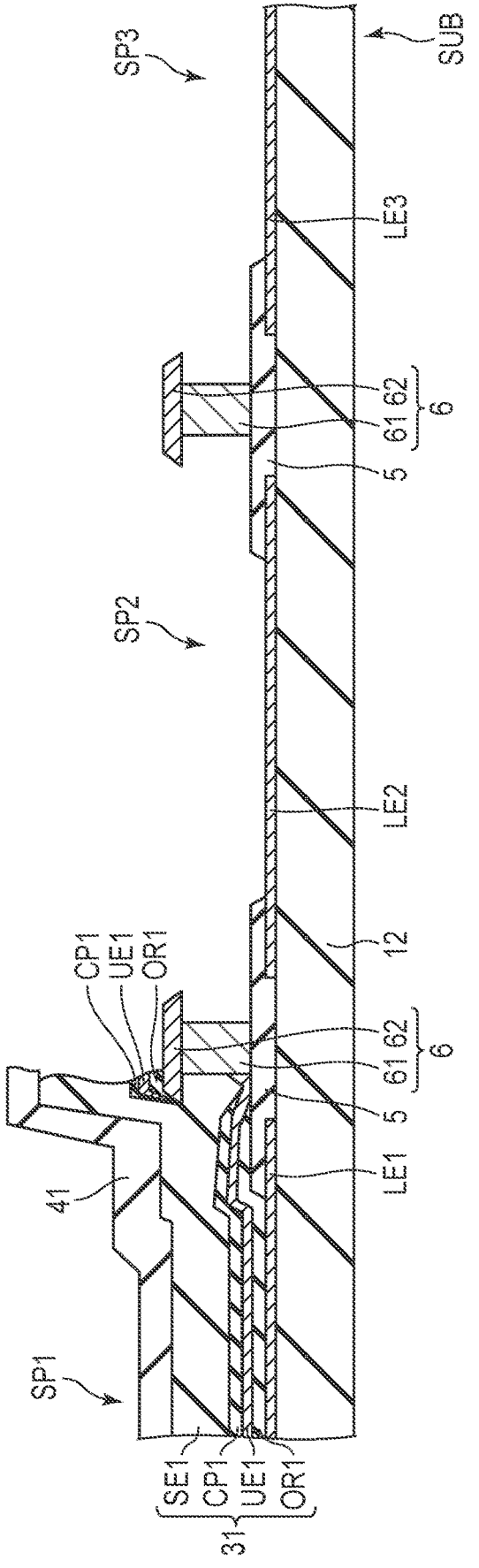
F I G. 17

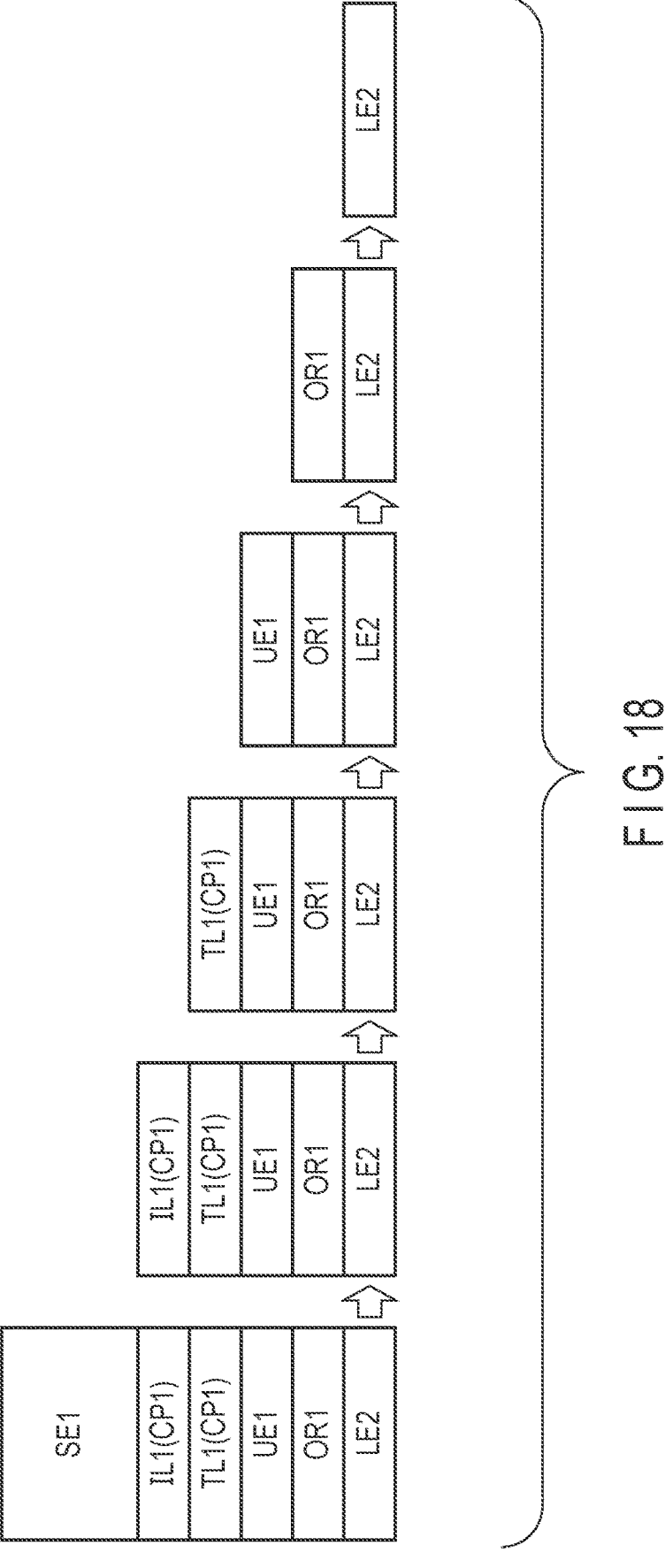
F I G. 18

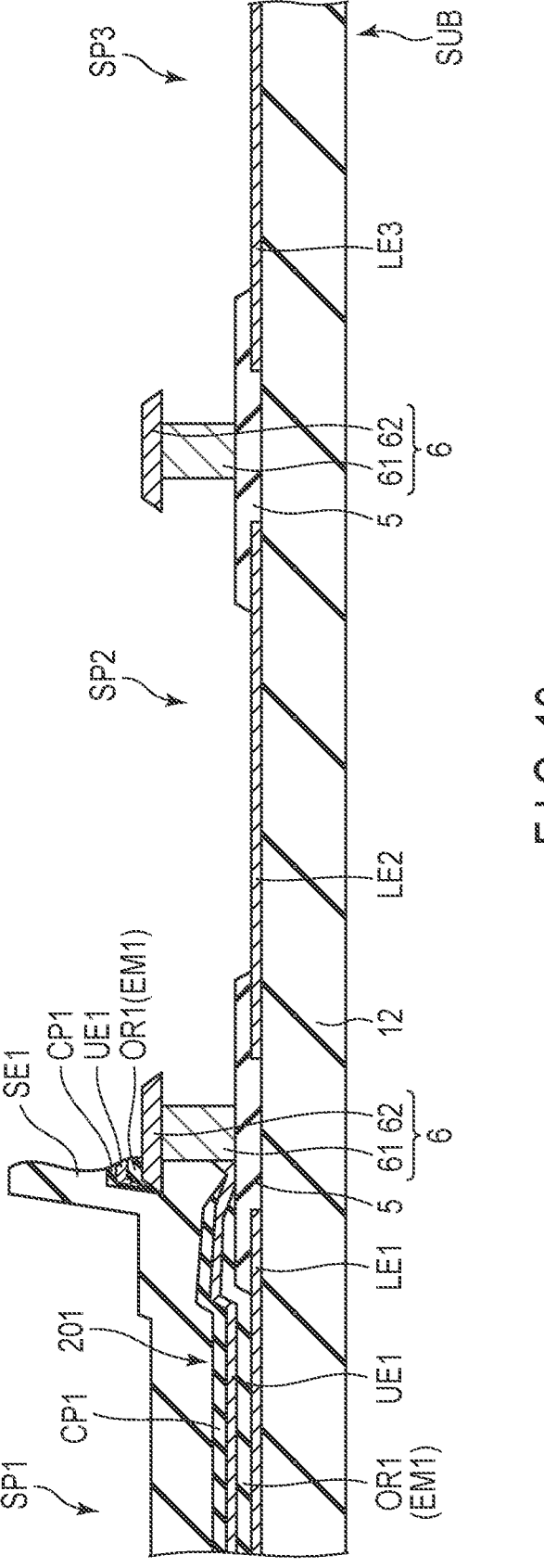
F I G. 19

MANUFACTURING METHOD OF DISPLAY DEVICE AND EVAPORATION DEVICE

CROSS-REFERENCE TO RELATED APPLICATIONS

This application is based upon and claims the benefit of priority from Japanese Patent Application No. 2022-083932, filed May 23, 2022, the entire contents of which are incorporated herein by reference.

FIELD

Embodiments described herein relate generally to a manufacturing method of a display device and an evaporation device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

BRIEF DESCRIPTION OF THE DRAWINGS

FIG. 3 is a schematic cross-sectional view of the display device DSP along the A-B line of FIG. 2.

FIG. 4 is a diagram showing an example of the configuration of display elements 201 to 203.

FIG. 5 is a schematic cross-sectional view of the display device DSP along the C-D line of FIG. 2.

FIG. 7 is another cross-sectional view of the display device DSP along the C-D line of FIG. 2.

FIG. 8 is another cross-sectional view of the display device DSP along the E-F line of FIG. 2.

FIG. 9 is a diagram for explaining an evaporation device EV.

FIG. 10 is a diagram for explaining a case where a processing substrate SUB is rotated 360° in the evaporation device EV shown in FIG. 9.

FIG. 11 is a diagram for explaining a case where the processing substrate SUB is rotated 180° in the evaporation device EV shown in FIG. 9.

FIG. 12 is a flow diagram for explaining an example of the manufacturing method of the display device DSP.

FIG. 13 is a diagram for explaining the manufacturing method of the display device DSP.

FIG. 14 is a diagram for explaining the manufacturing method of the display device DSP.

FIG. 16 is a diagram for explaining the manufacturing method of the display device DSP.

FIG. 17 is a diagram for explaining the manufacturing method of the display device DSP.

FIG. 18 is a diagram for explaining the process of removing the first thin film 31.

FIG. 19 is a diagram for explaining the manufacturing method of the display device DSP.

DETAILED DESCRIPTION

Figure 1:
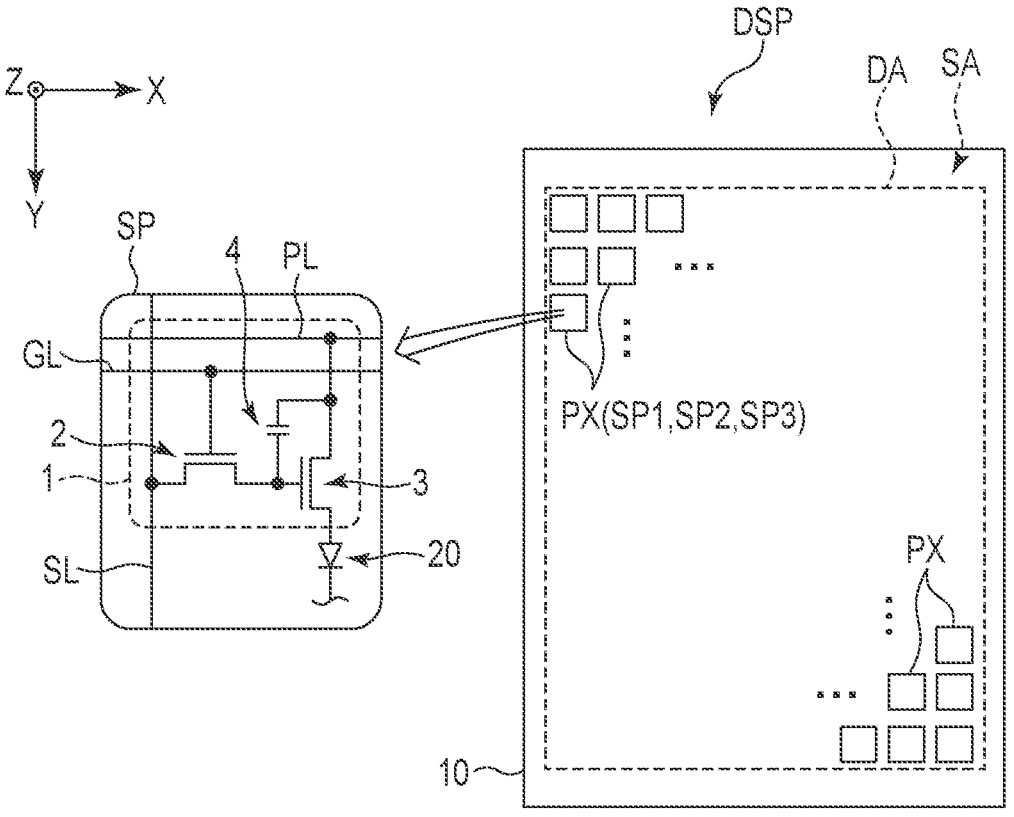
FIG. 1 is a diagram showing a configuration example of a display device DSP.

Embodiments described herein aim to provide a manufacturing method of a display device and an evaporation device such that the reduction in reliability can be prevented.

In general, according to one embodiment, a manufacturing method of a display device comprises preparing a processing substrate by forming a lower electrode above a substrate, forming a rib comprising an aperture overlapping the lower electrode, and forming a partition including a lower portion located on the rib and an upper portion located on the lower portion and protruding from a side surface of the lower portion, forming an organic layer on the lower electrode in the aperture, and forming an etching stopper layer on the organic layer. The forming the etching stopper layer includes carrying the processing substrate into a chamber, inside the chamber, emitting a material for forming the etching stopper layer from an evaporation source which inclines with respect to a normal of the processing substrate, and conveying the processing substrate while rotating the processing substrate in a plane orthogonal to the normal, and depositing the material emitted from the evaporation source on the processing substrate.

According to another embodiment, an evaporation device comprises a chamber, an evaporation source accommodated in the chamber, and a conveyance mechanism which conveys a processing substrate carried into the chamber while rotating the processing substrate in a plane orthogonal to a normal of the processing substrate. The evaporation source inclines with respect to the normal of the processing substrate and is configured to emit a material for forming an etching stopper layer to the processing substrate which is conveyed while being rotated by the conveyance mechanism.

The embodiments can provide a manufacturing method of a display device and an evaporation device such that the reduction in reliability can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view. When terms indicating the positional relationships of two or more structural elements, such as "on", "above" "between" and "face", are used, the target structural elements may be directly in contact with each other or may be spaced apart from each other as a gap or another structural element is interposed between them. The positive direction of the Z-axis is referred to as an upward direction or a direction to an upper side.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that the combination of subpixels is not limited to three elements. The combination may consist of two elements or may consist of four or more elements by adding subpixel SP4, etc., to subpixels SP1 to SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and the drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Figure 2:
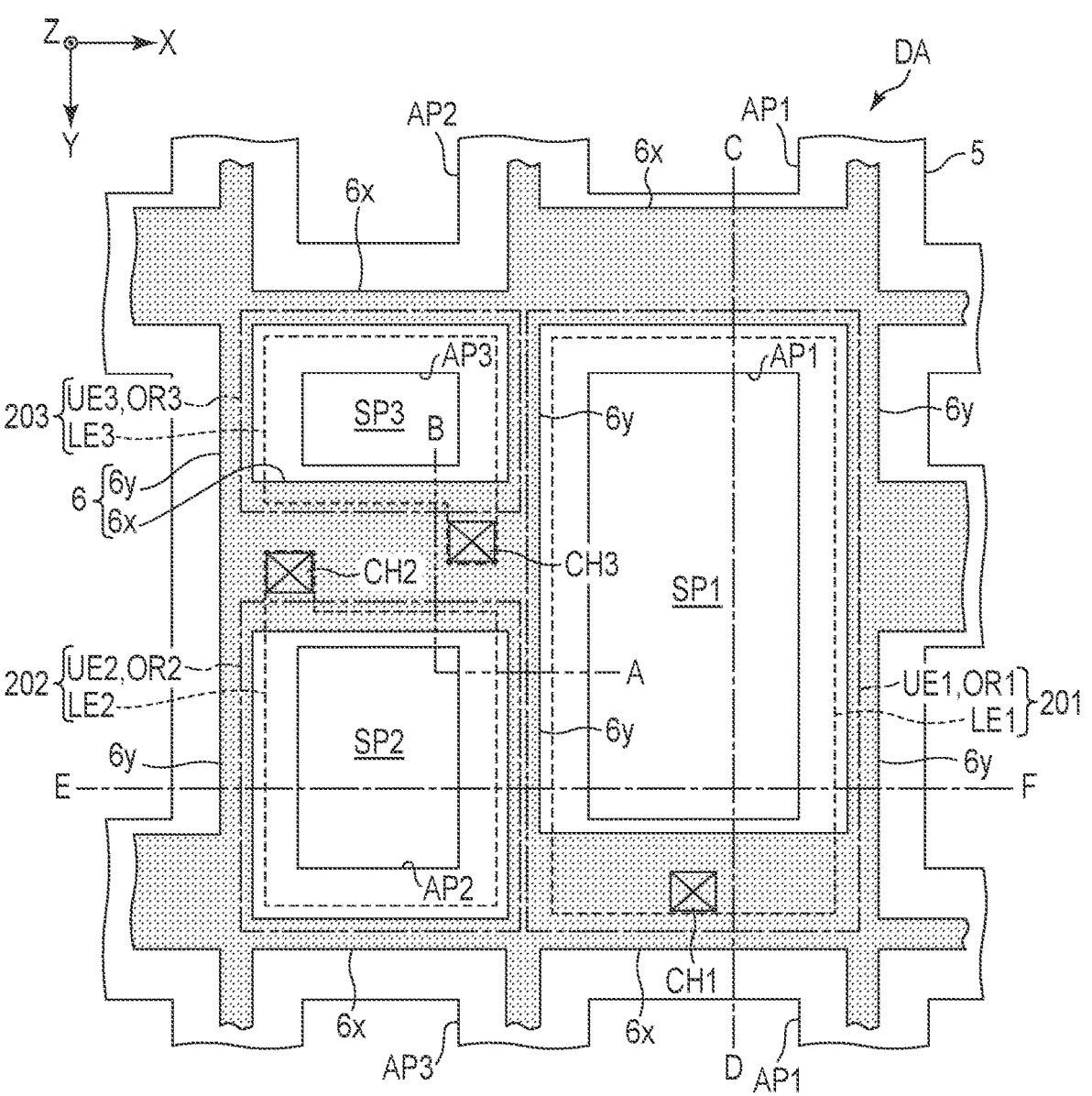
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP2 and SP3 are arranged in the second direction Y. Further, each of subpixels SP2 and SP3 is adjacent to subpixel SP1 in the first direction X.

When subpixels SP1, SP2 and SP3 are provided with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP2 and AP3 which are adjacent to each other in the second direction Y and between two apertures AP1 which are adjacent to each other in the second direction Y. Each second partition 6y is provided between the apertures AP1 and AP2 which are adjacent to each other in the first direction X and between the apertures AP1 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. It should be noted that the outer shape of each of the lower electrodes, organic layers and upper electrodes shown in the figure does not necessarily reflect the accurate shape.

The lower electrode LE1, the upper electrode UE1 and the organic layer OR1 constitute the display element 201 of subpixel SP1. The lower electrode LE2, the upper electrode UE2 and the organic layer OR2 constitute the display element 202 of subpixel SP2. The lower electrode LE3, the upper electrode UE3 and the organic layer OR3 constitute the display element 203 of subpixel SP3.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

For example, the display element 201 of subpixel SP1 is configured to emit light in a blue wavelength range. The display element 202 of subpixel SP2 is configured to emit light in a green wavelength range. The display element 203 of subpixel SP3 is configured to emit light in a red wavelength range.

FIG. 3 is a schematic cross-sectional view of the display device DSP along the A-B line of FIG. 2.

A circuit layer 11 is provided on the substrate 10 described above. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 12 and the rib 5. Of the lower electrodes LE1, LE2 and LE3, between the lower electrodes which are adjacent to each other, the insulating layer 12 is covered with the rib 5.

The partition 6 includes a lower portion (stem) 61 provided on the rib 5 and an upper portion (shade) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape. Of the upper portion 62, a portion which protrudes to the aperture AP1 relative to the lower portion 61 is referred to as a protrusion 621. A portion which protrudes to the aperture AP2 relative to the lower portion 61 is referred to as a protrusion 622. A portion which protrudes to the aperture AP3 relative to the lower portion 61 is referred to as a protrusion 623.

The organic layer OR1 is in contact with the lower electrode LE1 through the aperture AP1, covers the lower electrode LE1 and overlaps part of the rib 5. The upper electrode UE1 faces the lower electrode LE1 and is provided on the organic layer OR1. Further, the upper electrode UE1 is in contact with a side surface of the lower portion 61. The organic layer OR1 and the upper electrode UE1 are located on the lower side relative to the upper portion 62.

The organic layer OR2 is in contact with the lower electrode LE2 through the aperture AP2, covers the lower electrode LE2 and overlaps part of the rib 5. The upper electrode UE2 faces the lower electrode LE2 and is provided on the organic layer OR2. Further, the upper electrode UE2 is in contact with a side surface of the lower portion 61. The organic layer OR2 and the upper electrode UE2 are located on the lower side relative to the upper portion 62.

The organic layer OR3 is in contact with the lower electrode LE3 through the aperture AP3, covers the lower electrode LE3 and overlaps part of the rib 5. The upper electrode UE3 faces the lower electrode LE3 and is provided on the organic layer OR3. Further, the upper electrode UE3 is in contact with a side surface of the lower portion 61. The organic layer OR3 and the upper electrode UE3 are located on the lower side relative to the upper portion 62.

In the example shown in FIG. 3, subpixels SP1, SP2 and SP3 include cap layers (optical adjustment layers) CP1, CP2 and CP3 for adjusting the optical property of the light emitted from the light emitting layers of the organic layers OR1, OR2 and OR3.

The cap layer CP1 is located in the aperture AP1, is located on the lower side relative to the upper portion 62 and is provided on the upper electrode UE1. The cap layer CP2 is located in the aperture AP2, is located on the lower side relative to the upper portion 62 and is provided on the upper electrode UE2. The cap layer CP3 is located in the aperture AP3, is located on the lower side relative to the upper portion 62 and is provided on the upper electrode UE3.

Sealing layers SE1, SE2 and SE3 are provided in subpixels SP1, SP2 and SP3, respectively.

The sealing layer SE1 is in contact with the cap layer CP1 and the lower and upper portions 61 and 62 of the partition 6 and continuously covers the members of subpixel SP1. The sealing layer SE2 is in contact with the cap layer CP2 and the lower and upper portions 61 and 62 of the partition 6 and continuously covers the members of subpixel SP2. The sealing layer SE3 is in contact with the cap layer CP3 and the lower and upper portions 61 and 62 of the partition 6 and continuously covers the members of subpixel SP3.

The sealing layers SE1, SE2 and SE3 are covered with a protective layer 13.

In the example shown in FIG. 3, part of the organic layer OR1, part of the upper electrode UE1 and part of the cap layer CP1 are located between the partition 6 and the sealing layer SE1, are provided on the upper portion 62 and are spaced apart from the portions located on the lower side relative to the upper portion 62.

Part of the organic layer OR2, part of the upper electrode UE2 and part of the cap layer CP2 are located between the partition 6 and the sealing layer SE2, are provided on the upper portion 62 and are spaced apart from the portions located on the lower side relative to the upper portion 62.

Part of the organic layer OR3, part of the upper electrode UE3 and part of the cap layer CP3 are located between the partition 6 and the sealing layer SE3, are provided on the upper portion 62 and are spaced apart from the portions located on the lower side relative to the upper portion 62.

The insulating layer 12 is an organic insulating layer. The rib 5 and the sealing layers SE1, SE2 and SE3 are inorganic insulating layers.

The sealing layers SE1, SE2 and SE3 are formed of, for example, the same inorganic insulating material.

The rib 5 is formed of silicon nitride (SiNx) as an example of inorganic insulating materials. It should be noted that the rib 5 may be formed as, as another inorganic insulating material, a single-layer body of one of silicon oxide (SiOx), silicon oxynitride (SiON) and aluminum oxide (Al$_2$O$_3$). The rib 5 may be formed as a stacked layer body of a combination consisting of at least two of a silicon nitride layer, a silicon oxide layer, a silicon oxynitride layer and an aluminum oxide layer.

The sealing layers SE1, SE2 and SE3 are formed of silicon nitride (SiNx) as an example of inorganic insulating materials. It should be noted that the sealing layers SE1, SE2 and SE3 may be formed as, as another inorganic insulating material, a single-layer body of one of silicon oxide (SiOx), silicon oxynitride (SiON) and aluminum oxide (Al$_2$O$_3$). Each of the sealing layers SE1, SE2 and SE3 may be formed as a stacked layer body of a combination consisting of at least two of a silicon nitride layer, a silicon oxide layer, a silicon oxynitride layer and an aluminum oxide layer. Thus, the sealing layers SE1, SE2 and SE3 may be formed of the same material as the rib 5.

The lower portion 61 of the partition 6 is formed of a conductive material and is electrically connected to the upper electrodes UE1, UE2 and UE3. Both the lower portion 61 and the upper portion 62 of the partition 6 may be conductive.

The thickness of the rib 5 is sufficiently less than the thicknesses of the partition 6 and the insulating layer 12. For example, the thickness of the rib 5 is greater than or equal to 200 nm but less than or equal to 400 nm.

The thickness of the lower portion 61 of the partition 6 (the thickness from the upper surface of the rib 5 to the lower surface of the upper portion 62) is greater than that of the rib 5.

The thickness of the sealing layer SE1, the thickness of the sealing layer SE2 and the thickness of the sealing layer SE3 are substantially equal to each other.

Each of the lower electrodes LE1, LE2 and LE3 may be formed of a transparent conductive material such as ITO or may comprise a multilayer structure of a metal material such as silver (Ag) and a transparent conductive material. Each of the upper electrodes UE1, UE2 and UE3 is formed of, for example, a metal material such as an alloy of magnesium and silver (MgAg). Each of the upper electrodes UE1, UE2 and UE3 may be formed of a transparent conductive material such as ITO.

The organic layer OR1 includes a light emitting layer EM1. The organic layer OR2 includes a light emitting layer EM2. The light emitting layer EM2 is formed of a material different from that of the light emitting layer EM1. The organic layer OR3 includes a light emitting layer EM3. The light emitting layer EM3 is formed of a material different from the materials of the light emitting layers EM1 and EM2.

The material of the light emitting layer EM1, the material of the light emitting layer EM2 and the material of the light emitting layer EM3 are materials which emit light in different wavelength ranges.

For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

The cap layers CP1, CP2 and CP3 are formed by, for example, a multilayer body of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that at least one of the cap layers CP1, CP2 and CP3 may be omitted.

The protective layer 13 is formed of a multilayer body of transparent thin films. For example, as the thin films, the multilayer body includes a thin film formed of an inorganic material and a thin film formed of an organic material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the organic layer OR1 emits light in a blue wavelength range. When a potential difference is formed between the lower electrode LE2 and the upper electrode UE2, the light emitting layer EM2 of the organic layer OR2 emits light in a green wavelength range. When a potential difference is formed between the lower electrode LE3 and the upper electrode UE3, the light emitting layer EM3 of the organic layer OR3 emits light in a red wavelength range.

FIG. 4 is a diagram showing an example of the configuration of the display elements 201 to 203. Here, in the example, this specification assumes that each lower electrode corresponds to an anode and each upper electrode corresponds to a cathode.

The display element 201 includes the organic layer OR1 between the lower electrode LE1 and the upper electrode UE1.

In the organic layer OR1, a hole injection layer HIL1, a hole transport layer HTL1, an electron blocking layer EBL1, the light emitting layer EM1, a hole blocking layer HBL1, an electron transport layer ETL1 and an electron injection layer EIL1 are stacked in this order.

The cap layer CP1 includes a transparent layer TL1 and an inorganic layer IL'. The transparent layer TL1 is provided on the upper electrode UE1. The inorganic layer IL1 is provided on the transparent layer TL1. The sealing layer SE1 is provided on the inorganic layer IL'.

The display element 202 includes the organic layer OR2 between the lower electrode LE2 and the upper electrode UE2.

In the organic layer OR2, a hole injection layer HIL2, a hole transport layer HTL2, an electron blocking layer EBL2, the light emitting layer EM2, a hole blocking layer HBL2, an electron transport layer ETL2 and an electron injection layer EIL2 are stacked in this order.

The cap layer CP2 includes a transparent layer TL2 and an inorganic layer IL2. The transparent layer TL2 is provided on the upper electrode UE2. The inorganic layer IL2 is provided on the transparent layer TL2. The sealing layer SE2 is provided on the inorganic layer IL2.

The display element 203 includes the organic layer OR3 between the lower electrode LE3 and the upper electrode UE3.

In the organic layer OR3, a hole injection layer HIL3, a hole transport layer HTL3, an electron blocking layer EBL3, the light emitting layer EM3, a hole blocking layer HBL3, an electron transport layer ETL3 and an electron injection layer EIL3 are stacked in this order.

The cap layer CP3 includes a transparent layer TL3 and an inorganic layer IL3. The transparent layer TL3 is provided on the upper electrode UE3. The inorganic layer IL3 is provided on the transparent layer TL3. The sealing layer SE3 is provided on the inorganic layer IL3.

The transparent layers TL1, TL2 and TL3 are, for example, organic layers each formed of an organic material, and are high refractive layers having refractive indices greater than those of the upper electrodes UE1, UE2 and UE3. For example, the inorganic layers IL1, IL2 and IL3 are transparent thin films formed of lithium fluoride (LiF) or silicon oxide (SiO) and are low refractive layers having refractive indices less than those of the transparent layers TL1, TL2 and TL3.

Each of the cap layers CP1, CP2 and CP3 may be a stacked layer body consisting of three or more layers.

It should be noted that each of the organic layers OR1, OR2 and OR3 may include, in addition to the functional layers described above, other functional layers such as a carrier generation layer as needed, or at least one of the above functional layers may be omitted.

The above functional layers are individually formed for each of the display elements 201 to 203. Thus, the thickness of each of the above functional layers may differ depending on the display element.

In the example shown in FIG. 4, in the display element 201, at least one of the upper electrode UE1 and the inorganic layer IL1 functions as an etching stopper layer when dry etching is applied to the sealing layer SE1. In the display element 202, at least one of the upper electrode UE2 and the inorganic layer IL2 functions as an etching stopper layer when dry etching is applied to the sealing layer SE2. In the display element 203, at least one of the upper electrode UE3 and the inorganic layer IL3 functions as an etching stopper layer when dry etching is applied to the sealing layer SE3.

When dry etching is applied to each of an etching stopper layer and a sealing layer on the same condition, and the etching rate of the etching stopper layer is compared with that of the sealing layer, the etching rate of the etching stopper layer (an upper electrode or an inorganic layer) is less than that of the sealing layer. In this configuration, when dry etching is performed for a stacked layer body in which the sealing layer is stacked on the etching stopper layer, while the sealing layer is removed, the progress of etching can be stopped in the etching stopper layer.

For example, the upper electrodes UE1, UE2 and UE3 which function as etching stopper layers are formed of a material different from the materials of the rib 5 and the sealing layers SE1, SE2 and SE3. For example, the rib 5 and the sealing layers SE1, SE2 and SE3 are formed of silicon nitride. The upper electrodes UE1, UE2 and UE3 are formed of an alloy of magnesium and silver, which is a material having a high resistance to dry etching compared to silicon nitride.

As another example, the inorganic layers IL', IL2 and IL3 which function as etching stopper layers are formed of a material different from the materials of the rib 5 and the sealing layers SE1, SE2 and SE3. For example, the rib 5 and the sealing layers SE1, SE2 and SE3 are formed of silicon nitride. The inorganic layers IL', IL2 and IL3 are formed of lithium fluoride, which is a material having a high resistance to dry etching compared to silicon nitride.

Here, this specification explains a case where the upper electrode UE1 functions as an etching stopper layer.

FIG. 5 is a schematic cross-sectional view of the display device DSP along the C-D line of FIG. 2. The cross-sectional view shown in FIG. 5 corresponds to a cross-sectional view which intersects with a pair of short sides of each subpixel SP1 in the first direction X and includes a plurality of subpixels SP1 arranged in the second direction Y. The illustrations of the substrate, circuit layer and protective layer shown in FIG. 3 are omitted in FIG. 5.

Now, this specification focuses attention on the subpixel SP1 located in the center of the figure. The both end portions of the organic layer OR1 in the second direction Y are located on the rib 5 and are spaced apart from the partition 6. In other words, between the partition 6 and the organic layer OR1, the rib 5 is exposed.

The upper electrode UE1 covers the organic layer OR1 and also covers the rib 5 between the organic layer OR1 and the partition 6. Each end portion of the upper electrode UE1 in the second direction Y is in contact with the lower portion 61 of the partition 6. In other words, in the example shown in the figure, in a pair of short sides of subpixel SP1 in the first direction X, the upper electrode UE1 is provided as an etching stopper layer between the rib 5 and the sealing layer SE1.

The cap layer CP1 is provided on the upper electrode UE1. In the example shown in the figure, the cap layer CP1 is spaced apart from the partition 6. However, part of the cap layer CP1 may be in contact with the partition 6.

Figure 6:
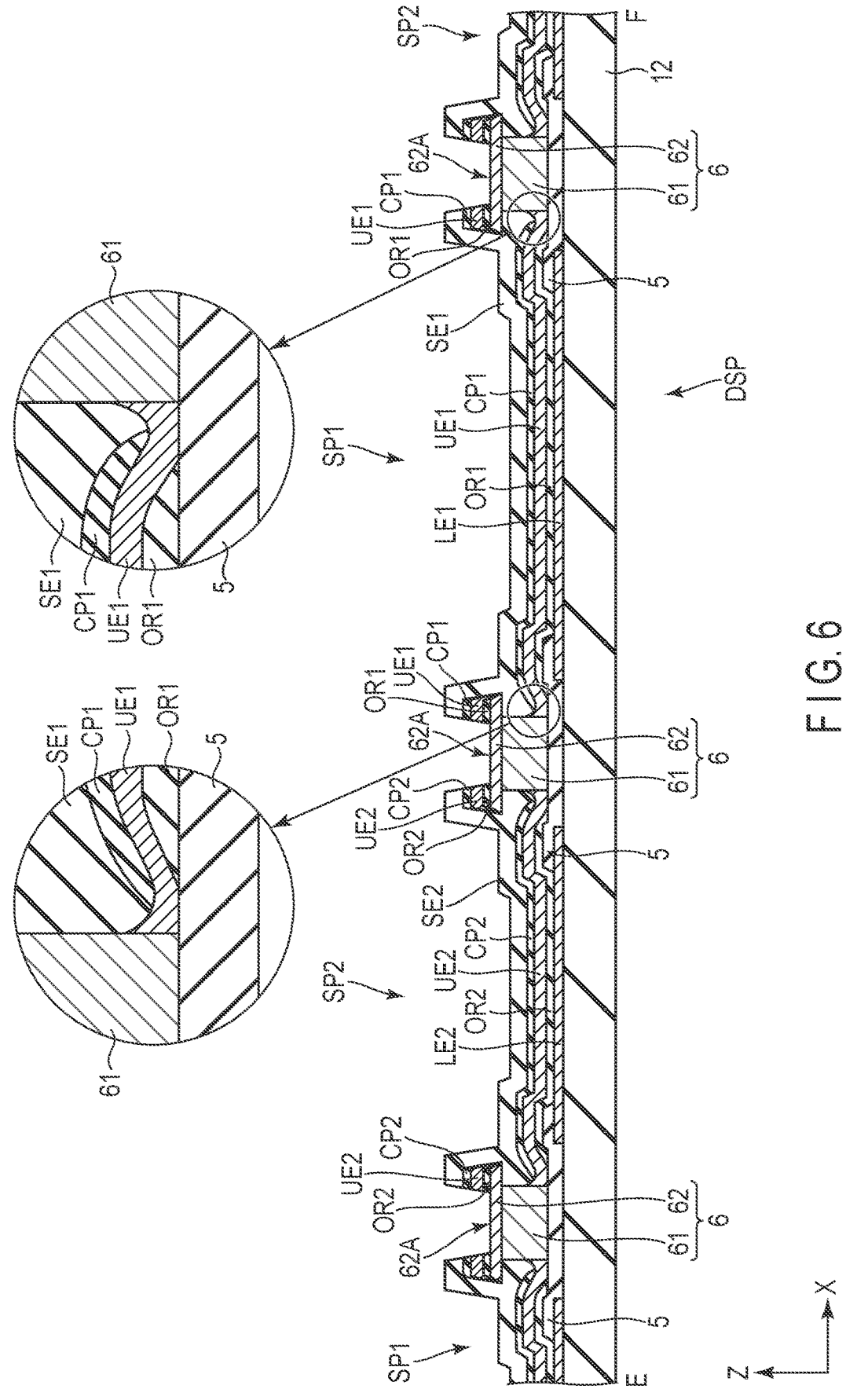
FIG. 6 is a schematic cross-sectional view of the display device DSP along the E-F line of FIG. 2.

FIG. 6 is a schematic cross-sectional view of the display device DSP along the E-F line of FIG. 2. The cross-sectional view shown in FIG. 6 corresponds to a cross-sectional view which intersects with a pair of long sides of subpixel SP1 in the second direction Y and includes subpixels SP1 and SP2 which are alternately arranged in the first direction X. The illustrations of the substrate, circuit layer and protective layer shown in FIG. 3 are omitted in FIG. 6.

Now, this specification focuses attention on the subpixel SP1 located on the right side of the figure. The both end portions of the organic layer OR1 in the first direction X are located on the rib 5 and are spaced apart from the partition 6. In other words, between the partition 6 and the organic layer OR1, the rib 5 is exposed.

The upper electrode UE1 covers the organic layer OR1 and also covers the rib 5 between the organic layer OR1 and the partition 6. Each end portion of the upper electrode UE1 in the first direction X is in contact with the lower portion 61 of the partition 6. In other words, in the example shown in the figure, in a pair of long sides of subpixels SP1 in the second direction Y, the upper electrode UE1 is provided as an etching stopper layer between the rib 5 and the sealing layer SE1.

Thus, in subpixel SP1, the upper electrode UE1 is in contact with the partition 6 in a pair of short sides in the first direction X and a pair of long sides in the second direction Y. In other words, the upper electrode UE1 is in contact with the partition 6 over the whole circumference of subpixel SP1 and covers the rib 5 between the partition 6 and the organic layer OR1.

Similarly, in subpixel SP2, the upper electrode UE2 covers the rib 5 between the partition 6 and the organic layer OR2 over the whole circumference of subpixel SP2. For example, this specification focuses attention on the subpixel SP2 located on the left side of FIG. 6. The both end portions of the organic layer OR2 in the first direction X are located on the rib 5 and are spaced apart from the partition 6. The upper electrode UE2 covers the organic layer OR2 and also covers the rib 5 between the organic layer OR2 and the partition 6. Each end portion of the upper electrode UE2 in the first direction X is in contact with the lower portion 61 of the partition 6. Thus, the upper electrode UE2 is provided as an etching stopper layer between the rib 5 and the sealing layer SE2.

Similarly, in subpixel SP3, the upper electrode UE3 covers the rib 5 between the partition 6 and the organic layer OR3 over the whole circumference of subpixel SP3 and is provided as an etching stopper layer between the rib 5 and the sealing layer SE3.

Now, this specification explains a case where the inorganic layer IL1 functions as an etching stopper layer.

FIG. 7 is a schematic cross-sectional view of the display device DSP along the C-D line of FIG. 2. The illustrations of the substrate, circuit layer and protective layer shown in FIG. 3 are omitted in FIG. 7.

As shown in the enlarged cross-sectional views of the figure, the inorganic layer IL1 included in the cap layer CP1 covers the transparent layer TL1 and is provided on the upper electrode UE1. The both end portions of the inorganic layer IL1 in the second direction Y are in contact with the lower portions 61 of the partition 6. In other words, in the example shown in the figure, in a pair of short sides of subpixel SP1 in the first direction X, the inorganic layer IL1 is provided as an etching stopper layer between the rib 5 and the sealing layer SE1.

FIG. 8 is a schematic cross-sectional view of the display device DSP along the E-F line of FIG. 2. The illustrations of the substrate, circuit layer and protective layer shown in FIG. 3 are omitted in FIG. 8.

Now, this specification focuses attention on the subpixel SP1 located on the right side of the figure. As shown in the enlarged cross-sectional views of the figure, the both end portions of the inorganic layer IL1 in the first direction X are in contact with the lower portions 61 of the partition 6. In other words, in the example shown in the figure, in a pair of long sides of subpixel SP1 in the second direction Y, the inorganic layer IL1 is provided as an etching stopper layer between the rib 5 and the sealing layer SE1.

Thus, in subpixel SP1, the inorganic layer IL1 is in contact with the partition 6 in a pair of short sides in the first direction X and a pair of long sides in the second direction Y. When the inorganic layer IL1 is in contact with the partition 6 over the whole circumference of subpixel SP1, the upper electrode UE1 should be in contact with the partition 6 along at least one side of subpixel SP1.

Similarly, in subpixel SP2, the inorganic layer IL2 is in contact with the partition 6 over the whole circumference of subpixel SP2. For example, this specification focuses attention on the subpixel SP2 located on the left side of FIG. 8. The both end portions of the inorganic layer IL2 in the first direction X are in contact with the lower portions 61 of the partition 6. Thus, the inorganic layer IL2 is provided as an etching stopper layer between the rib 5 and the sealing layer SE2.

Similarly, in subpixel SP3, the inorganic layer IL3 is in contact with the partition 6 over the whole circumference of subpixel SP3 and is provided as an etching stopper layer between the rib 5 and the sealing layer SE3.

In the examples shown in FIG. 5 to FIG. 8, the etching stopper layer is in contact with the partition 6 over the whole circumference of each subpixel. However, the configuration is not limited to these examples. For example, the etching stopper layer may be in contact with the partition 6 along a pair of short sides and one long side. Alternatively, the etching stopper layer may be in contact with the partition 6 along one short side and one long side.

Now, this specification explains an evaporation device EV for forming an etching stopper layer ES.

FIG. 9 is a diagram for explaining the evaporation device EV.

The evaporation device EV comprises a conveyance mechanism 100, an evaporation source 110 and a chamber 130. The chamber 130 comprises a carry-in entrance 131 for carrying a processing substrate SUB in and a carry-out exit 132 for carrying the processing substrate SUB out. The manufacturing device of the display device explained in this specification is an in-line manufacturing device. The carry-in entrance 131 is connected to another evaporation device. The carry-out exit 132 is further connected to another evaporation device.

The conveyance mechanism 100 is configured to convey the processing substrate SUB while rotating the processing substrate SUB in a plane orthogonal to the normal N of the processing substrate SUB (or the normal of the substrate 10). The processing substrate SUB shown here is prepared by forming, for example, the circuit layer 11, the insulating layer 12, the lower electrodes LE, the rib 5, the partition 6 and the organic layers OR above the substrate 10. The conveyance mechanism 100 rotates the processing substrate SUB 90° or more while conveying the processing substrate SUB from the carry-in entrance 131 to the carry-out exit 132 in a conveyance direction TD.

The evaporation source 110 is configured to emit a material M for forming the etching stopper layer ES. In the example shown in the figure, the evaporation source 110 is accommodated in the chamber 130 and is secured to the chamber 130 by a securing tool (not shown). The evaporation source 110 comprises a nozzle 120 which controls the emission direction of the material M. A discharge port 121 is formed at the distal end of the nozzle 120. This evaporation source 110 inclines with respect to the normal N of the processing substrate SUB (or the normal of the substrate 10).

The evaporation source 110 shown in the figure inclines to the right side of the figure with respect to the normal N. At this time, the discharge port 121 faces the carry-in entrance 131 side. In other words, the evaporation source 110 emits the material M in the opposite direction of the arrow of the conveyance direction TD of the processing substrate SUB. The inclination angle $\theta$ of the evaporation source 110 can be defined as the angle between the normal N of the processing substrate SUB and the extension direction of the nozzle 120 in the section defined by the conveyance direction TD of the processing substrate SUB and the normal N. The inclination angle $\theta$ of the evaporation source 110 is an acute angle clockwise with respect to the normal N. The inclination angle $\theta$ is, for example, greater than or equal to 5° but less than or equal to 40°.

For example, when an upper electrode UE is formed as the etching stopper layer ES, the material M emitted from the evaporation source 110 is, for example, a mixture of magnesium (Mg) and silver (Ag). When an inorganic layer IL is formed as the etching stopper layer ES, the material M emitted from the evaporation source 110 is, for example, lithium fluoride (LiF).

FIG. 10 is a diagram for explaining a case where the processing substrate SUB is rotated 360° in the evaporation device EV shown in FIG. 9. FIG. 10 is a diagram in which the processing substrate SUB is seen in plan view.

The processing substrate SUB is conveyed in the conveyance direction TD while rotating 360° based on the rotation axis R parallel to the normal N of the processing substrate SUB shown in FIG. 9, by the conveyance mechanism 100. To facilitate understanding of how the processing substrate SUB rotates, a black circle is added to the vicinity of one of the corners located on a diagonal line of the processing substrate SUB, and a cross mark is added to the vicinity of the other corner.

In the evaporation device EV shown in FIG. 9 and FIG. 10, the following process is performed with respect to the processing substrate SUB which is carried in the chamber 130 through the carry-in entrance 131.

First, the emission of the material M from the evaporation source 110 is started. The conveyance mechanism 100 conveys the processing substrate SUB while rotating the processing substrate SUB. The material M emitted from the evaporation source 110 is deposited on the processing substrate SUB. At this time, the material M emitted from the evaporation source 110 is deposited on the organic layer OR and reaches the lower portion 61 of the partition 6. As the processing substrate SUB rotates 360° while the material M is deposited, the material M reaches the lower portion 61 of the partition 6 over the whole circumference of each subpixel. This process enables the formation of an etching stopper layer ES comprising a section which is in contact with the partition 6 over the whole circumference of each subpixel. The rib 5 located between the organic layer OR and the partition 6 is covered with the etching stopper layer ES.

FIG. 11 is a diagram for explaining a case where the processing substrate SUB is rotated 180° in the evaporation device EV shown in FIG. 9.

The processing substrate SUB is conveyed in the conveyance direction TD while rotating 180° based on the rotation axis R parallel to the normal N of the processing substrate SUB shown in FIG. 9, by the conveyance mechanism 100.

As the processing substrate SUB rotates 180° while the material M emitted from the evaporation source 110 is deposited on the processing substrate SUB, the material M reaches the lower portion 61 of the partition 6 over a pair of short sides and one long side of each subpixel. This process enables the formation of an etching stopper layer which is in contact with the partition 6 along a pair of short sides and one long side.

Although not shown in the figures, the processing substrate SUB may be conveyed in the conveyance direction TD while rotating 90° based on the rotation axis R. In this case, as the processing substrate SUB rotates 90° while the material M emitted from the evaporation source 110 is deposited on the processing substrate SUB, the material M reaches the lower portion 61 of the partition 6 over one short side and one long side of each subpixel. This process enables the formation of an etching stopper layer which is in contact with the partition 6 along one short side and one long side is formed.

The evaporation device EV of the examples shown in FIG. 9 to FIG. 11 corresponds to a case where the evaporation device EV is configured such that the processing substrate SUB is conveyed in a state where the evaporation surface of the processing substrate SUB is located on the upper side of the substrate 10 (face-up) and the evaporation source 110 emits the material M to the lower side. However, the evaporation device EV is not limited to this configuration. For example, the evaporation device EV may be configured such that the processing substrate SUB is conveyed in a state where the evaporation surface of the processing substrate SUB is located on the lower side of the substrate 10 (face-down) and the evaporation source 110 emits the material M to the upper side. The evaporation device EV may be configured such that the processing substrate SUB is conveyed in a state where the processing substrate SUB perpendicularly stands with respect to a horizontal plane and the evaporation source 110 emits the material M in a lateral direction.

Now, this specification explains an example of the manufacturing method of the display device DSP.

FIG. 12 is a flow diagram for explaining an example of the manufacturing method of the display device DSP.

The manufacturing method shown here roughly includes the process of preparing the processing substrate SUB comprising subpixels SP1, SP2 and SP3 (step ST1), the process of forming the display element 201 of subpixel SP1 (step ST2), the process of forming the display element 202 of subpixel SP2 (step ST3) and the process of forming the display element 203 of subpixel SP3 (step ST4).

In step ST1, first, the processing substrate SUB is prepared by forming the lower electrode LE1 of subpixel SP1, the lower electrode LE2 of subpixel SP2, the lower electrode LE3 of subpixel SP3, the rib 5 and the partition 6 above the substrate 10. As shown in FIG. 3, the circuit layer 11 and the insulating layer 12 are also formed between the substrate 10 and the lower electrodes LE1, LE2 and LE3.

In step ST2, first, a first thin film 31 including the light emitting layer EM1 is formed over subpixel SP1, subpixel SP2 and subpixel SP3 (step ST21). Subsequently, a first resist 41 patterned into a predetermined shape is formed on the first thin film 31 (step ST22). Subsequently, part of the first thin film 31 is removed by etching using the first resist 41 as a mask (step ST23). Subsequently, the first resist 41 is removed (step ST24). In this way, subpixel SP1 is formed. Subpixel SP1 comprises the display element 201 comprising the first thin film 31 having a predetermined shape.

In step ST3, first, a second thin film 32 including the light emitting layer EM2 is formed over subpixel SP1, subpixel SP2 and subpixel SP3 (step ST31). Subsequently, a second resist 42 patterned into a predetermined shape is formed on the second thin film 32 (step ST32). Subsequently, part of the second thin film 32 is removed by etching using the second resist 42 as a mask (step ST33). Subsequently, the second resist 42 is removed (step ST34). In this way, subpixel SP2 is formed. Subpixel SP2 comprises the display element 202 comprising the second thin film 32 having a predetermined shape.

In step ST4, first, a third thin film 33 including the light emitting layer EM3 is formed over subpixel SP1, subpixel SP2 and subpixel SP3 (step ST41). Subsequently, a third resist 43 patterned into a predetermined shape is formed on the third thin film 33 (step ST42). Subsequently, part of the third thin film 33 is removed by etching using the third resist 43 as a mask (step ST43). Subsequently, the third resist 43 is removed (step ST44). In this way, subpixel SP3 is formed. Subpixel SP3 comprises the display element 203 comprising the third thin film 33 having a predetermined shape.

It should be noted that the detailed illustrations of the second thin film 32, the second resist 42, the third thin film 33 and the third resist 43 are omitted.

Now, this specification explains step ST1 and step ST2 with reference to FIG. 13 to FIG. 19. The section shown in each of FIG. 13, FIG. 14, FIG. 16, FIG. 17 and FIG. 19 corresponds to, for example, the section taken along the A-B line of FIG. 2.

First, in step ST1, as shown in FIG. 13, the processing substrate SUB is prepared. The process of preparing the processing substrate SUB includes the process of forming the circuit layer 11 on the substrate 10, the process of forming the insulating layer 12 on the circuit layer 11, the process of forming the lower electrode LE1 of subpixel SP1, the lower electrode LE2 of subpixel SP2 and the lower electrode LE3 of subpixel SP3 on the insulating layer 12, the process of forming the rib 5 comprising the apertures AP1, AP2 and AP3 overlapping the lower electrodes LE1, LE2 and LE3, respectively, and the process of forming the partition 6 including the lower portion 61 provided on the rib 5 and the upper portion 62 provided on the lower portion 61 and protruding from the side surfaces of the lower portion 61. In each of FIG. 14, FIG. 16, FIG. 17 and FIG. 19, the illustrations of the substrate 10 and the circuit layer 11 lower than the insulating layer 12 are omitted.

The rib 5 is formed of, for example, silicon nitride.

Subsequently, in step ST21, as shown FIG. 14, the first thin film 31 is formed over subpixel SP1, subpixel SP2 and subpixel SP3. The process of forming the first thin film 31 includes, the process of forming the organic layer OR1 including the light emitting layer EM1 on the processing substrate SUB, the process of forming the upper electrode UE1 as an etching stopper layer on the organic layer OR1, the process of forming the cap layer CP1 on the upper electrode UE1 and the process of forming the sealing layer SE1 on the cap layer CP1. Thus, in the example shown in the figure, the first thin film 31 includes the organic layer OR1, the upper electrode UE1, the cap layer CP1 and the sealing layer SE1.

The organic layer OR1 is formed on each of the lower electrode LE1, the lower electrode LE2 and the lower electrode LE3 and is also formed on the partition 6. Of the organic layer OR1, the portion formed on each upper portion 62 is spaced apart from the portion formed on each of the lower electrodes.

The upper electrode UE1 is formed on the organic layer OR1 immediately above each of the lower electrodes LE1, LE2 and LE3, covers the rib 5 and is in contact with the lower portions 61 of the partition 6. The upper electrode UE1 is also formed on the organic layer OR1 immediately above each upper portion 62. Of the upper electrode UE1, the portion which is formed immediately above each upper portion 62 is spaced apart from the portion which is formed immediately above each of the lower electrodes.

The cap layer CP1 includes the transparent layer TL1 and the inorganic layer IL1 shown in FIG. 4. The cap layer CP1 is formed on the upper electrode UE1 immediately above each of the lower electrode LE1, the lower electrode LE2 and the lower electrode LE3, and is also formed on the upper electrode UE1 immediately above each upper portion 62. Of the cap layer CP1, the portion which is formed immediately above each upper portion 62 is spaced apart from the portion which is formed immediately above each of the lower electrodes.

The sealing layer SE1 is formed so as to cover the cap layer CP1 and the partition 6. In other words, the sealing layer SE1 is formed on the cap layer CP1 immediately above each of the lower electrode LE1, the lower electrode LE2 and the lower electrode LE3, and is also formed on the cap layer CP1 immediately above each upper portion 62. In the sealing layer SE1, the portion which is formed immediately above each upper portion 62 is continuous with the portion which is formed immediately above each of the lower electrodes.

The sealing layer SE1 is formed of, for example, silicon nitride.

Figure 15:
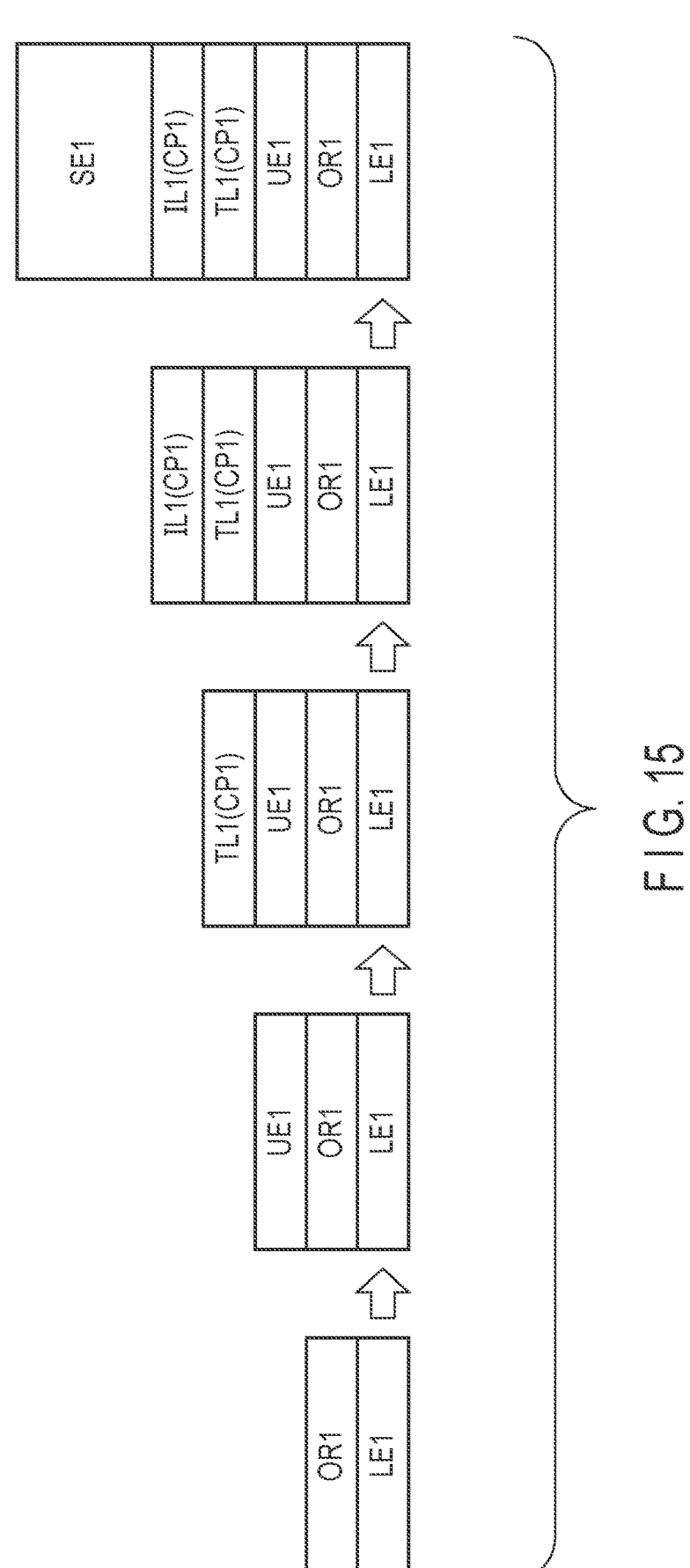
FIG. 15 is a diagram for explaining the process of forming a first thin film 31.

FIG. 15 is a diagram for explaining the process of forming the first thin film 31. Here, as an example, this specification explains the process of forming the first thin film 31 on the lower electrode LE1. The sections of the first thin film 31 on the lower electrode LE1 are arranged in the formation order from the left to right of the figure.

First, the organic layer OR1 is formed on the lower electrode LE1. The organic layer OR1 includes various functional layers and the light emitting layer as is explained with reference to FIG. 4. Each layer of the organic layer OR1 is formed by, for example, a vapor deposition method.

Subsequently, as an etching stopper layer, the upper electrode UE1 is formed on the organic layer OR1. The upper electrode UE1 is formed of an alloy of magnesium and silver by a vapor deposition method. The upper electrode UE1 can be formed in the evaporation device EV explained with reference to FIG. 9, etc.

Subsequently, the transparent layer TL1 of the cap layer CP1 is formed on the upper electrode UE1. The transparent layer TL1 is formed by, for example, a vapor deposition method.

Subsequently, the inorganic layer IL1 of the cap layer CP1 is formed on the transparent layer TL1. The inorganic layer IL1 is formed of, for example, lithium fluoride or silicon oxide. When the inorganic layer IL1 is formed of lithium fluoride as an etching stopper layer, a vapor deposition method is applied. The inorganic layer IL1 can be formed in the evaporation device EV explained with reference to FIG. 9, etc. It should be noted that, when the inorganic layer IL1 is formed of silicon oxide, a chemical vapor deposition (CVD) method is applied.

Subsequently, the sealing layer SE1 is formed on the inorganic layer IL'. The sealing layer SE1 is formed by, for example, a CVD method.

Subsequently, in step ST22, as shown in FIG. 16, the patterned first resist 41 is formed on the sealing layer SE1. The first resist 41 covers the first thin film 31 of subpixel SP1, and the first thin film 31 is exposed from the first resist 41 in subpixels SP2 and SP3. Thus, the first resist 41 overlaps the sealing layer SE1 located immediately above the lower electrode LE1. The first resist 41 extends from subpixel SP1 to the upper side of the partition 6. On the partition 6 between subpixel SP1 and subpixel SP2, the first resist 41 is provided on the subpixel SP1 side (the left side of the figure), and the sealing layer SE1 is exposed from the first resist 41 on the subpixel SP2 side (the right side of the figure). The sealing layer SE1 is exposed from the first resist 41 in subpixel SP2 and subpixel SP3.

Subsequently, in step ST23, as shown in FIG. 17, etching is applied using the first resist 41 as a mask. By this process, the first thin film 31 exposed from the first resist 41 in subpixels SP2 and SP3 is removed, and the first thin film 31 remains in subpixel SP1. In this way, the lower electrode LE2 is exposed in subpixel SP2, and the rib 5 surrounding the lower electrode LE2 is exposed. In subpixel SP3, the lower electrode LE3 is exposed, and the rib 5 surrounding the lower electrode LE3 is exposed. On the partition 6 between subpixel SP1 and subpixel SP2, the subpixel SP2 side is exposed. Further, the partition 6 between subpixel SP2 and subpixel SP3 is exposed.

FIG. 18 is a diagram for explaining the process of removing the first thin film 31. Here, as an example, this specification explains the process of removing the first thin film 31 formed on the lower electrode LE2 in subpixel SP2. The sections of the first thin film 31 on the lower electrode LE2 are arranged in the removal order from the left to right of the figure.

First, dry etching is performed using the first resist 41 as a mask to remove the sealing layer SE1 exposed from the first resist 41.

Subsequently, wet etching is performed using the first resist 41 as a mask to remove the inorganic layer IL1 of the cap layer CP1 exposed from the sealing layer SE1.

Subsequently, dry etching is performed using the first resist 41 as a mask to remove the transparent layer TL1 of the cap layer CP1 exposed from the inorganic layer IL'.

Subsequently, wet etching is performed using the first resist 41 as a mask to remove the upper electrode UE1 exposed from the transparent layer TL1.

Subsequently, dry etching is performed using the first resist 41 as a mask to remove the organic layer OR1 exposed from the upper electrode UE1 such that the lower electrode LE2 is exposed.

Similarly, in subpixel SP3, the sealing layer SE1, the cap layer CP1, the upper electrode UE1 and the organic layer OR1 are removed.

Subsequently, in step ST24, as shown in FIG. 19, the first resist 41 is removed. Thus, the sealing layer SE1 of subpixel SP1 is exposed. Through these steps ST21 to ST24, the display element 201 is formed in subpixel SP1. The display element 201 consists of the lower electrode LE1, the organic layer OR1 including the light emitting layer EM1, the upper electrode UE1 and the cap layer CP1. The display element 201 is covered with the sealing layer SE1.

A stacked layer body of the organic layer OR1 including the light emitting layer EM1, the upper electrode UE1, the cap layer CP1 and the sealing layer SE1 is formed on the partition 6 between subpixel SP1 and subpixel SP2. Of the partition 6, the portion on the subpixel SP1 side is covered with the sealing layer SE1. It should be noted that the stacked layer body on the partition 6 shown in FIG. 18 is completely removed in some cases.

According to the present embodiment, as shown in FIG. 16, before etching is applied to the sealing layer SE1, in subpixels SP2 and SP3, the upper electrode UE1 between the rib 5 and the sealing layer SE1 covers the rib 5 between the partition 6 and the organic layer OR1. Thus, the sealing layer SE1 is not in contact with the rib 5. The upper electrode UE1 functions as an etching stopper layer. The etching rate of the upper electrode UE1 is less than that of the sealing layer SE1. Thus, regarding the dry etching of the sealing layer SE1, after the sealing layer SE1 is completely removed, the progress of dry etching can be stopped in the upper electrode UE1. By this configuration, the rib 5 is not substantially damaged when dry etching is applied to the sealing layer SE1. This configuration prevents the formation of an undesired hole (a penetration path for moisture) which penetrates the rib 5 so as to expose the insulating layer 12. Further, the configuration prevents the change in the colors of the lower electrodes because of the effect of undesired moisture. Moreover, the configuration prevents an occurrence of pixel defects in which the organic EL elements do not emit light because of damage to the anodes and the organic EL elements.

In this way, the reduction in reliability can be prevented.

As explained above, the present embodiment can provide a manufacturing method of a display device and an evaporation device such that the reduction in reliability can be prevented and the manufacturing yield can be improved.

All of the manufacturing methods of a display device and evaporation devices that can be implemented by a person of ordinary skill in the art through arbitrary design changes to the manufacturing method and evaporation device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A manufacturing method of a display device, comprising:

preparing a processing substrate by forming a lower electrode above a substrate, forming a rib comprising an aperture overlapping the lower electrode, and forming a partition including a lower portion located on the rib and an upper portion located on the lower portion and protruding from a side surface of the lower portion;

forming an organic layer on the lower electrode in the aperture; and forming an etching stopper layer on the organic layer, wherein the forming the etching stopper layer includes:

carrying the processing substrate into a chamber;

inside the chamber, emitting a material for forming the etching stopper layer from an evaporation source which inclines with respect to a normal of the processing substrate; and conveying the processing substrate while rotating the processing substrate in a plane orthogonal to the normal, and depositing the material emitted from the evaporation source on the processing substrate.

2. The method of claim 1, wherein the processing substrate is conveyed while the processing substrate is rotated 360° inside the chamber.

3. The method of claim 1, wherein the processing substrate is conveyed while the processing substrate is rotated 180° inside the chamber.

4. The method of claim 1, wherein an upper electrode is formed on the organic layer as the etching stopper layer.

5. The method of claim 4, further comprising:

forming a cap layer on the etching stopper layer;

forming a sealing layer on the cap layer;

forming a patterned resist on the sealing layer; and applying dry etching to the sealing layer using the resist as a mask, wherein when the dry etching is applied to the sealing layer, an etching rate of the etching stopper layer is less than an etching rate of the sealing layer.

6. The method of claim 5, wherein the rib and the sealing layer are formed of silicon nitride.

7. The method of claim 6, wherein the upper electrode is formed of an alloy of magnesium and silver.

8. The method of claim 1, further comprising:

forming an upper electrode on the organic layer;

forming a transparent layer on the upper electrode;

forming an inorganic layer as the etching stopper layer on the transparent layer;

forming a sealing layer on the inorganic layer;

forming a patterned resist on the sealing layer; and applying dry etching to the sealing layer using the resist as a mask, wherein when the dry etching is applied to the sealing layer, an etching rate of the etching stopper layer is less than an etching rate of the sealing layer.

9. The method of claim 8, wherein
the rib and the sealing layer are formed of silicon nitride.

10. The method of claim 9, wherein
the inorganic layer is formed of lithium fluoride (LiF).

* * * * *